(12) United States Patent
Lin et al.

(10) Patent No.: US 9,349,711 B2
(45) Date of Patent: May 24, 2016

(54) SEMICONDUCTOR DEVICE WITH FACE-TO-FACE CHIPS ON INTERPOSER AND METHOD OF MANUFACTURING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 14/689,655

(22) Filed: Apr. 17, 2015

(65) Prior Publication Data

US 2016/0005717 A1  Jan. 7, 2016

Related U.S. Application Data

(62) Division of application No. 14/523,892, filed on Oct. 26, 2014, now Pat. No. 9,147,667.

(60) Provisional application No. 61/895,517, filed on Oct. 25, 2013, provisional application No. 61/918,070, filed on Dec. 19, 2013.

(51) Int. Cl.
*H01L 23/00* (2006.01)
*H01L 23/498* (2006.01)
(Continued)

(52) U.S. Cl.
CPC .......... *H01L 25/0657* (2013.01); *H01L 21/561* (2013.01); *H01L 23/13* (2013.01); *H01L 23/34* (2013.01); *H01L 23/367* (2013.01); *H01L 23/3675* (2013.01); *H01L 23/49827* (2013.01); *H01L 23/49838* (2013.01); *H01L 23/5384* (2013.01); *H01L 23/5385* (2013.01);

(Continued)

(58) Field of Classification Search
CPC ....... H01L 23/00; H01L 23/34; H01L 23/538; H01L 23/49816; H01L 23/498; H01L 23/367; H01L 23/3675; H01L 23/49827; H01L 25/065; H01L 25/0657; H01L 2225/06517; H01L 2225/06548; H01L 2225/06555; H01L 2225/06572; H01L 2225/06589; H01L 2225/06593; H01L 24/17; H01L 2224/16227; H01L 29/66; H01L 23/4334; H01L 2924/15311; H01L 2924/01029; H01L 2924/01079; H01L 2224/48091; H01L 2224/48247
USPC ......... 257/734, 712, 659, 665, 675, 625, 706, 257/707, 717, 720, 796, 686, 687, 723, 777, 257/787, 790
See application file for complete search history.

(56) References Cited

U.S. PATENT DOCUMENTS 6,281,042 B1   8/2001   Ahn et al.
7,626,829 B2  12/2009   Watanabe et al.
(Continued)

*Primary Examiner* — Chuong A Luu
(74) *Attorney, Agent, or Firm* — Pai Patent & Trademark Law Firm; Chao-Chang David Pai

(57) ABSTRACT

A method of making a semiconductor device with face-to-face chips on interposer includes the step of attaching a chip-on-interposer subassembly on a heat spreader with the chip inserted into a cavity of the heat spreader so that the heat spreader provides mechanical support for the interposer. The heat spreader also provides thermal dissipation, electromagnetic shielding and moisture barrier for the enclosed chip. In the method, a second chip is also electrically coupled to a second surface of the interposer and an optional second heat spreader is attached to the second chip.

14 Claims, 22 Drawing Sheets

(51) Int. Cl.
*H01L 25/065* (2006.01)
*H01L 23/538* (2006.01)
*H01L 23/34* (2006.01)
*H01L 23/13* (2006.01)
*H01L 23/367* (2006.01)
*H01L 21/56* (2006.01)
*H01L 23/544* (2006.01)
*H01L 23/373* (2006.01)
*H01L 23/42* (2006.01)

(52) U.S. Cl.
CPC ............ *H01L23/544* (2013.01); *H01L 24/17* (2013.01); *H01L 24/81* (2013.01); *H01L 24/92* (2013.01); *H01L 24/97* (2013.01); *H01L 23/3735* (2013.01); *H01L 23/42* (2013.01); *H01L 24/83* (2013.01); *H01L 25/0655* (2013.01); *H01L 2223/54426* (2013.01); *H01L 2223/54486* (2013.01); *H01L 2224/0401* (2013.01); *H01L 2224/05568* (2013.01); *H01L 2224/1134* (2013.01); *H01L 2224/131* (2013.01); *H01L 2224/13144* (2013.01); *H01L 2224/13147* (2013.01); *H01L 2224/16227* (2013.01); *H01L 2224/16235* (2013.01); *H01L 2224/32225* (2013.01); *H01L 2224/32245* (2013.01); *H01L 2224/73204* (2013.01); *H01L 2224/73253* (2013.01); *H01L 2224/81203* (2013.01); *H01L 2224/81207* (2013.01); *H01L 2224/81815* (2013.01); *H01L 2224/83192* (2013.01); *H01L 2224/92225* (2013.01); *H01L 2224/97* (2013.01); *H01L 2225/06517* (2013.01); *H01L 2225/06548* (2013.01); *H01L 2225/06555* (2013.01); *H01L 2225/06572* (2013.01); *H01L 2225/06589* (2013.01); *H01L 2225/06593* (2013.01); *H01L 2924/00014* (2013.01); *H01L 2924/014* (2013.01); *H01L 2924/15192* (2013.01); *H01L 2924/15311* (2013.01); *H01L 2924/15313* (2013.01); *H01L 2924/16153* (2013.01); *H01L 2924/181* (2013.01)

(56) References Cited

U.S. PATENT DOCUMENTS

| | | | |
|---|---|---|---|
| 8,008,121 B2 | 8/2011 | Choi et al. | |
| 8,502,372 B2 | 8/2013 | Osenbach | |
| 9,196,575 B1 * | 11/2015 | Lee | H01L 23/49568 |
| 2004/0238857 A1 * | 12/2004 | Beroz | H01F 17/0033 257/232 |
| 2008/0315372 A1 * | 12/2008 | Kuan | H01L 21/568 257/659 |
| 2013/0093073 A1 * | 4/2013 | Chen | H01L 24/14 257/686 |
| 2013/0105963 A1 * | 5/2013 | Choi | H01L 24/73 257/706 |
| 2014/0210107 A1 | 7/2014 | Zhai | |

* cited by examiner

SEMICONDUCTOR DEVICE WITH FACE-TO-FACE CHIPS ON INTERPOSER AND METHOD OF MANUFACTURING THE SAME

CROSS REFERENCE TO RELATED APPLICATIONS

This application is a division of U.S. patent application Ser. No. 14/523,892 filed Oct. 26, 2014 now U.S. Pat. No. 9,147,667, which claims the priority benefit of U.S. Provisional Application No. 61/895,517 filed Oct. 25, 2013 and the priority benefit of U.S. Provisional Application No. 61/918,070 filed Dec. 19, 2013. The entirety of each said Provisional Application is incorporated herein by reference.

FIELD OF THE INVENTION

The present invention relates to a semiconductor device, more particularly, to a semiconductor device having chips face-to-face mounted on an interposer and thermally connected to separate heat spreaders and a method of making the same.

DESCRIPTION OF RELATED ART

The convergence of mobility, communication, and computing has created significant thermal, electrical and reliability challenges to the semiconductor packaging industry. Despite numerous face-to-face chip assemblies reported in the literature, many performance-related deficiencies remain. For example, the semiconductor devices disclosed in U.S. Pat. Nos. 6,281,042 and 7,626,829 have chips disposed on both sides of an interposer so that the face-to-face chips can be electrically connected through the interposer. However, as interposer is typically made of fragile material such as silicon or glass with many through vias penetrated therein, its mechanical strength and rigidity is questionable to sustain board level assembly. As a result, a freestanding interposer without adequate mechanical support presents a reliability problem which can induce cracking and thus cause electrical disconnection between the chips.

Face-to-face chip assemblies disclosed in U.S. Patent Publication No. 2014/0210107 and U.S. Pat. Nos. 8,502,372 and 8,008,121 improve the device reliability by providing mechanical support for interposer. However, these approaches render serious performance degradation problems as the heat generated by the encapsulated chip cannot be dissipated properly through the thermally insulating materials.

For the reasons stated above, and for other reasons stated below, an urgent need exists to develop a new apparatus and method to interconnect chips with face-to-face configuration without using a free-standing interposer so as to improve device reliability, and avoid the use of thermally insulating material such as mold compound or resin laminate to encapsulate the chips so as to prevent overheating of the chips that creates enormous concerns in device reliability and electrical performance.

SUMMARY OF THE INVENTION

A primary objective of the present invention is to provide a semiconductor device with face-to-face chips mounted on an interposer in which the interposer is firmly attached to a heat spreader so that the heat spreader can provide necessary mechanical support for the interposer that connects face-to-face chips mounted thereon.

Another objective of the present invention is to provide a semiconductor device with face-to-face chips mounted on an interposer in which at least one chip is enclosed in a cavity of a heat spreader so as to effectively dissipate the heat generated by the chip, thereby improving signal integrity and electrical performance of the semiconductor device.

In accordance with the foregoing and other objectives, the present invention proposes a semiconductor device that includes an interposer, top and bottom chips, and a top heat spreader. The top chip is electrically coupled to a top side of the interposer by bumps and embedded in a cavity of the top heat spreader with the top side of the interposer attached to the top heat spreader. The bottom chip is electrically coupled to a bottom side of the interposer by bumps and thus is electrically connected to the top chip by through vias of the interposer. Optionally, the semiconductor device may further include a balancing layer, a bottom heat spreader and an interconnect substrate. The bottom heat spreader is thermally connected to the bottom chip to provide thermal dissipation for the bottom chip. The balancing layer covers sidewalls of the interposer and preferably extends laterally to peripheral edges of the semiconductor device. The interconnect substrate is disposed on the top or bottom side of the interposer and is electrically coupled to the interposer for further fan-out routing.

In another aspect, the present invention provides a method of making a semiconductor device with face-to-face chips on interposer, including the steps of: providing an interposer that includes a first surface, a second surface opposite to the first surface, first contact pads on the first surface, second contact pads on the second surface, and through vias that electrically couple the first contact pads and the second contact pads; electrically coupling a first chip to the first contact pads of the interposer by a plurality of bumps to provide a chip-on-interposer subassembly; providing a first heat spreader having a cavity; attaching the chip-on-interposer subassembly to the first heat spreader using a thermally conductive material with the first chip inserted into the cavity and the interposer laterally extending beyond the cavity; optionally providing a balancing layer that covers sidewalls of the interposer and the first heat spreader; with the chip-on-interposer subassembly attached to the first heat spreader, electrically coupling a second chip to the second contact pads of the interposer by a plurality of bumps and optionally electrically coupling an interconnect substrate to additional second contact pads on the second surface of the interposer by a plurality of solder balls; and optionally attaching a second heat spreader on the second chip.

In yet another aspect, the present invention provides a method of making another semiconductor device with face-to-face chips on interposer, including the steps of: providing an interposer that includes a first surface, a second surface opposite to the first surface, first contact pads on the first surface, second contact pads on the second surface, and through vias that electrically couple the first contact pads and the second contact pads; electrically coupling a first chip to the first contact pads of the interposer by a plurality of bumps to provide a chip-on-interposer subassembly; providing a first heat spreader having a cavity; attaching the chip-on-interposer subassembly to the first heat spreader using a thermally conductive material with the first chip inserted into the cavity and the interposer laterally extending beyond the cavity; providing a balancing layer that covers sidewalls of the interposer and the first heat spreader; with the chip-on-interposer subassembly attached to the first heat spreader, electrically coupling a second chip to the second contact pads of the interposer by a plurality of bumps; attaching a second heat spreader to the second chip using a thermally conductive material with the second chip inserted into a cavity of the second heat spreader and the interposer laterally extending beyond the cavity of the second heat spreader; selectively removing portions of the first or second heat spreader to expose additional first contact pads on the first surface or additional second contact pads on the second surface of the interposer; and optionally electrically coupling an interconnect substrate to the additional first or second contact pads of the interposer by a plurality of solder balls.

Unless specific descriptions or steps necessarily occur in a certain order, the sequence of the above-mentioned steps is not limited to that set forth above and may be changed or reordered according to desired design.

In yet another aspect, the present invention provides a semiconductor device with face-to-face chips on interposer, including a first chip, a second chip, an interposer, a first heat spreader, optionally a balancing layer, optionally a second heat spreader and optionally an interconnect substrate, wherein (i) the interposer has a first surface, a second surface opposite to the first surface, first contact pads on the first surface, second contact pads on the second surface, and through vias that electrically couple the first contact pads and the second contact pads; (ii) the first chip is electrically coupled to the first contact pads of the interposer by a plurality of bumps to provide a chip-on-interposer subassembly; (iii) the chip-on-interposer subassembly is attached to the first heat spreader using a thermally conductive material with the first chip enclosed in a cavity of the first heat spreader and the interposer laterally extending beyond the cavity; (iv) the second chip is electrically coupled to the second contact pads of the interposer by a plurality of bumps; (v) the optional balancing layer covers sidewalls of the interposer; (vi) the optional second heat spreader is attached on the second chip, or is attached to the second chip using a thermally conductive material with the second chip inserted into a cavity of the second heat spreader and the interposer laterally extending beyond the cavity of the second heat spreader; and (vii) the optional interconnect substrate is electrically coupled to additional first contact pads on the first surface or additional second contact pads on the second surface of the interposer by a plurality of solder balls.

The semiconductor device and the method of making the same according to the present invention have numerous advantages. For instance, electrically coupling the chips to the opposite sides of the interposer by flip chip attachment offers the shortest interconnect distance between the chips face-to-face mounted on the opposite sides of the interposer. Attaching the chip-on-interposer subassembly to the heat spreader with the chip inserted into the cavity is particularly advantageous as the heat spreader can provide thermal dissipation for the embedded chip and also provide a support platform to proceed with an interconnection procedure on the other side of the interposer.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-22 are schematic views showing a method of making a semiconductor device that includes an interposer, chips, a heat spreader and a balancing layer in accordance with an embodiment of the present invention.

Figure 22:
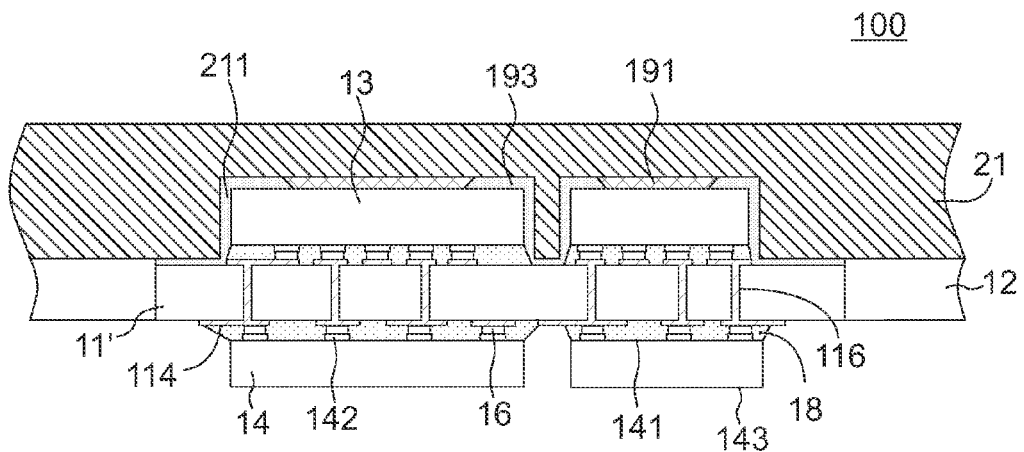
FIG. 22 is a cross-sectional view showing a state in which additional chips are mounted on the structure of FIG. 20 to finish the fabrication of a semiconductor device in accordance with the first embodiment of the present invention.

As shown in FIG. 22, the semiconductor device 100 includes an interposer 11', first and second chips 13, 14, a balancing layer 12 and a heat spreader 21. The first and second chips 13, 14 are face-to-face mounted on both opposite sides of the interposer 11' by flip chip process. The interposer 11' provides fan-out routing for the first and second chips 13, 14, and also provides electrical connections between the adjoining first chips 13 and between the adjoining second chips 14. The interposer 11' and the first chips 13 are attached to the heat spreader 21 using a thermally conductive material 191 and an adhesive 193, with the first chips 13 embedded in cavities 211 of the heat spreader 21. The balancing layer 12 laterally covers sidewalls of the interposer 11' and laterally extends to the peripheral edges of the semiconductor device.

FIGS. 1, 3, 4, 6 and 8 are cross-sectional views showing a process of fabricating chip-on-interposer subassemblies in accordance with an embodiment of the present invention, and FIGS. 2, 5, 7 and 9 are top perspective views corresponding to FIGS. 1, 4, 6 and 8, respectively.

Figure 1:
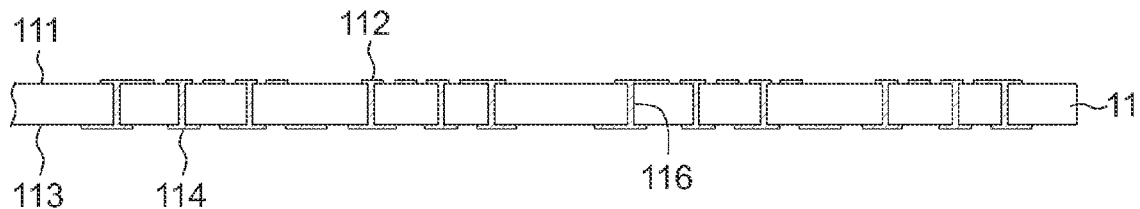
FIGS. 1 and 2 are cross-sectional and top perspective views, respectively, of an interposer panel in accordance with the first embodiment of the present invention.
Figure 2:
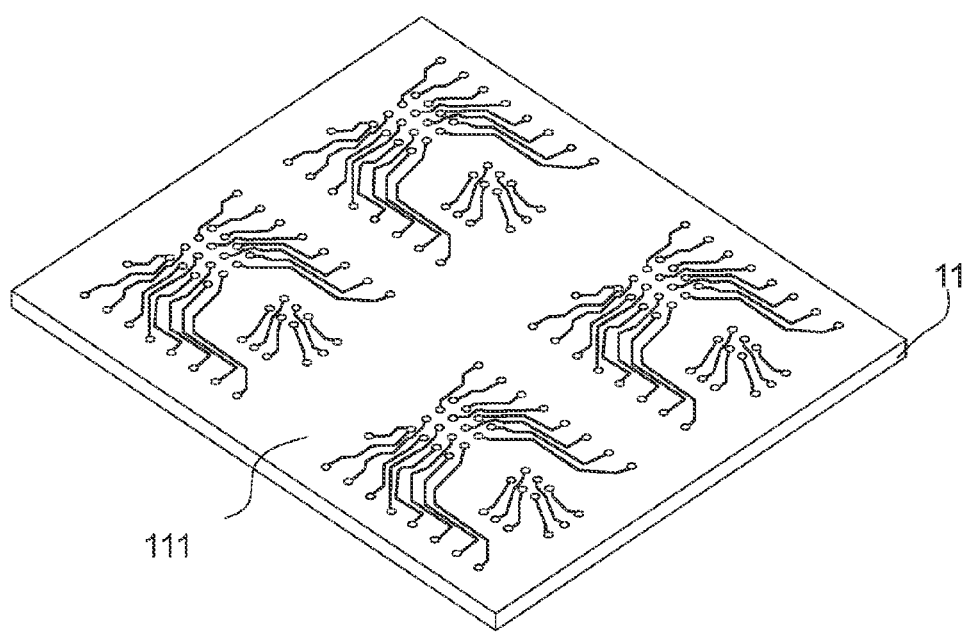

FIGS. 1 and 2 are cross-sectional and top perspective views, respectively, of an interposer panel 11, which includes a first surface 111, a second surface 113 opposite to the first surface 111, first contact pads 112 on the first surface 111, second contact pads 114 on the second surface 113, and through vias 116 that electrically couple the first contact pads 112 and the second contact pads 114. The interposer panel 11 can be a silicon, glass, ceramic or graphite interposer that has a thickness of 50 microns to 500 microns. In this embodiment, the interposer panel 11 is a ceramic interposer of 200 microns in thickness.

Figure 3:
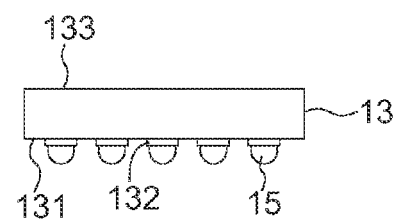
FIG. 3 is a cross-sectional view of a chip with bumps mounted thereon in accordance with the first embodiment of the present invention.

FIG. 3 is a cross-sectional view of a first chip 13 with bumps 15 mounted thereon. The first chip 13 includes an active surface 131, an inactive surface 133 opposite to the active surface 131, and I/O pads 132 on the active surface 131. The bumps 15 are mounted on the I/O pads 132 of the first chip 13 and may be solder, gold or copper pillars.

Figure 4:
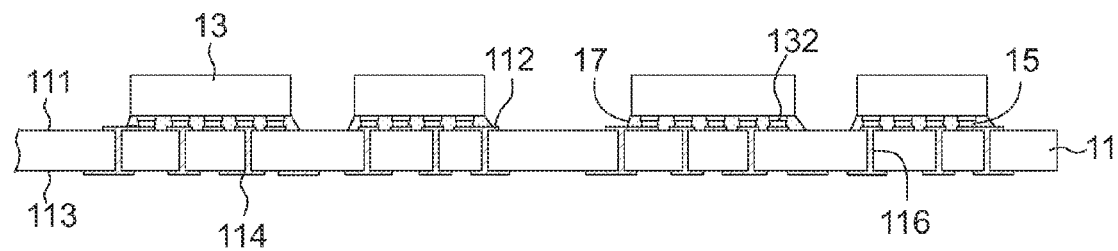
FIGS. 4 and 5 are cross-sectional and top perspective views, respectively, of a panel-scale assembly with the chips of FIG. 3 electrically coupled to the interposer panel of FIGS. 1 and 2 in accordance with the first embodiment of the present invention.
Figure 5:
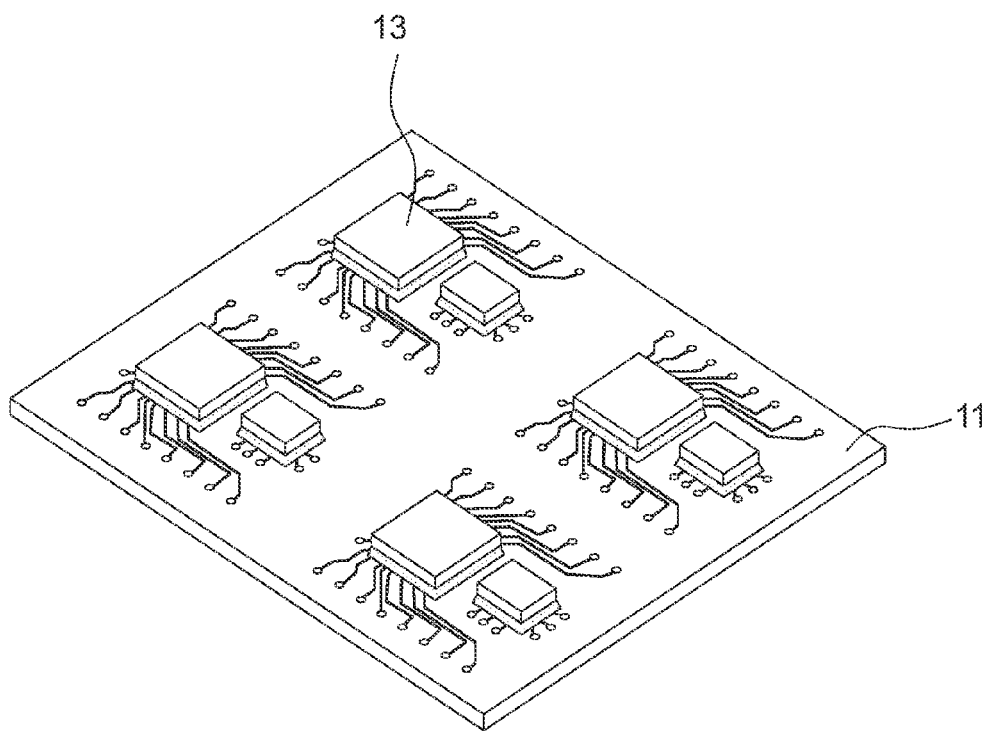

FIGS. 4 and 5 are cross-sectional and top perspective views, respectively, of the panel-scale assembly with multiple first chips 13 electrically coupled to the interposer panel 11. The first chips 13 can be electrically coupled to the first contact pads 112 of the interposer panel 11 using the bumps 15 by thermal compression, solder reflow or thermosonic bonding. As an alternative, the bumps 15 may be first deposited on the first contact pads 112 of the interposer panel 11, and then the first chips 13 are electrically coupled to the interposer panel 11 by the bumps 15. Optionally, underfill 17 can be further provided to fill the gap between the interposer panel 11 and the first chips 13.

Figure 6:
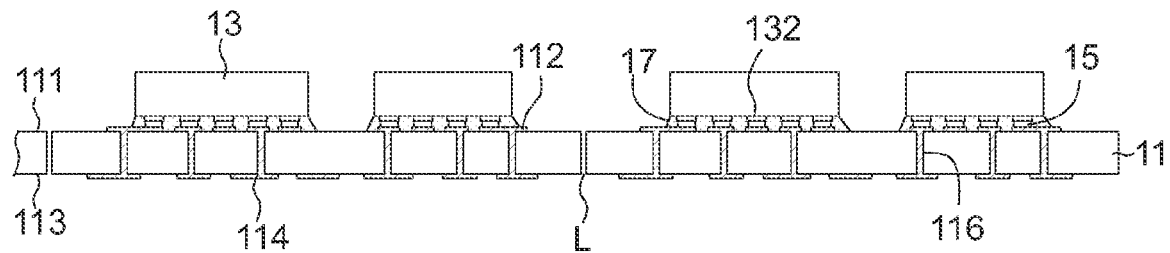
FIGS. 6 and 7 are cross-sectional and top perspective views, respectively, of a diced state of the panel-scale assembly of FIGS. 4 and 5 in accordance with the first embodiment of the present invention.
Figure 7:
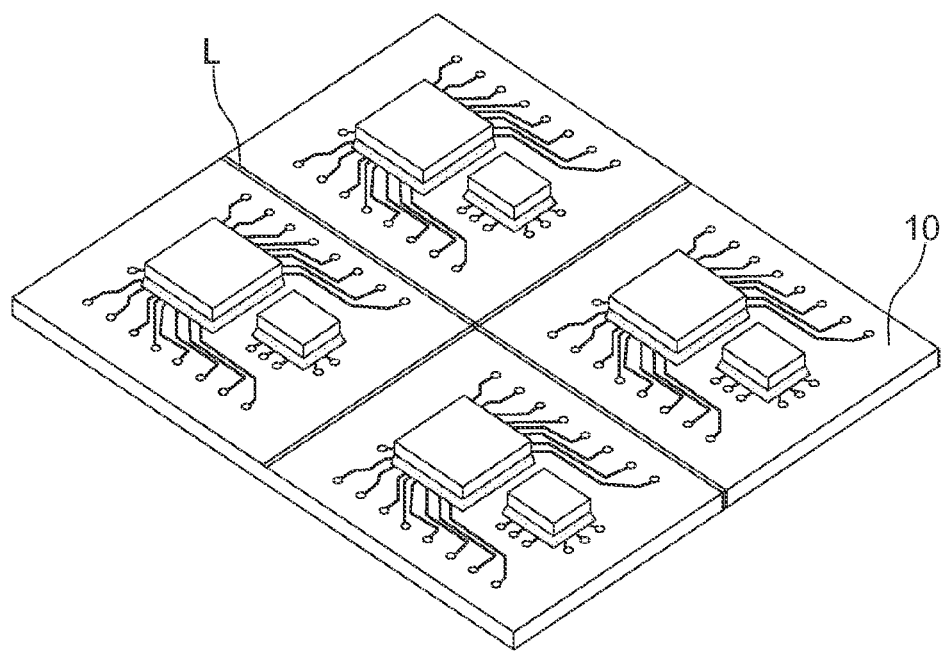

FIGS. 6 and 7 are cross-sectional and top perspective views, respectively, of the panel-scale assembly diced into individual pieces. The panel-scale assembly is singluated into individual chip-on-interposer subassembly 10 along dicing lines "L".

Figure 8:
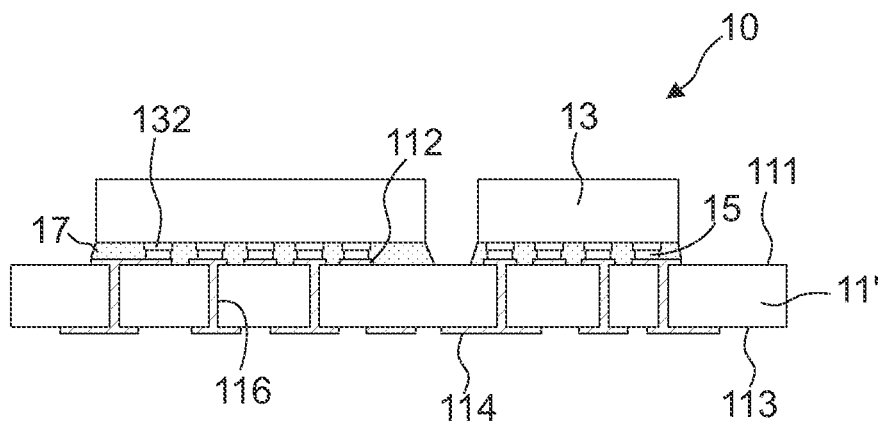
FIGS. 8 and 9 are cross-sectional and top perspective views, respectively, of a chip-on-interposer subassembly corresponding to a diced unit in FIGS. 6 and 7 in accordance with the first embodiment of the present invention.
Figure 9:
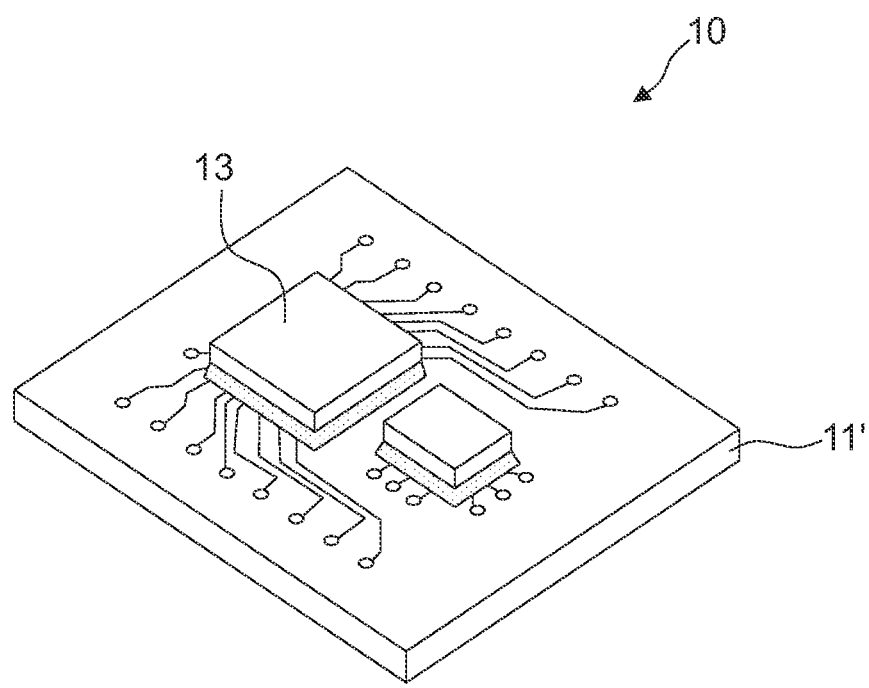

FIGS. 8 and 9 are cross-sectional and top perspective views, respectively, of the individual chip-on-interposer subassembly 10. In this illustration, the chip-on-interposer subassembly 10 includes two first chips 13 electrically coupled on the diced interposer 11'.

Figure 10:
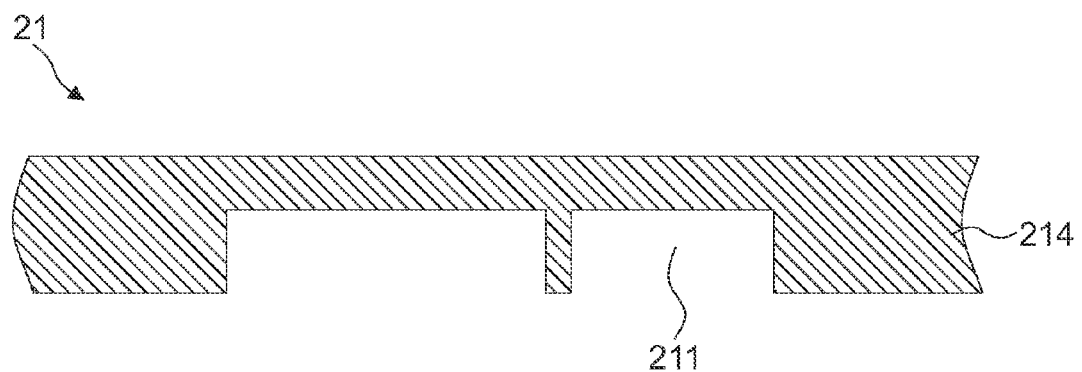
FIGS. 10 and 11 are cross-sectional and bottom perspective views, respectively, of a heat spreader in accordance with the first embodiment of the present invention.
Figure 11:
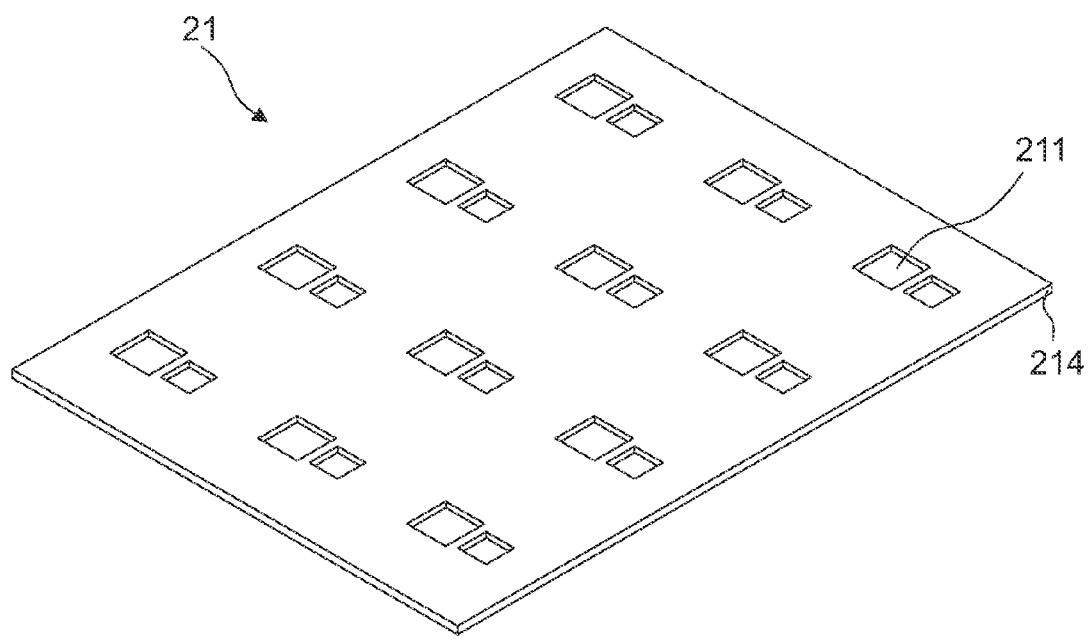

FIGS. 10 and 11 are cross-sectional and bottom perspective views, respectively, of a heat spreader 21 having cavities 211. The heat spreader 21 can be provided by forming the cavities 211 in a metal plate 214. The metal plate 214 can have a thickness of 0.1 mm to 10 mm, and may be made of copper, aluminum, stainless steel or their alloys. In this embodiment, the metal plate 214 is a copper sheet with a thickness of 2 mm. Each of the cavities 211 includes an entrance and can have a different size and cavity depth. The cavity depth can range from 0.05 mm to 1.0 mm. Herein, the depth of the cavity 211 is 0.21 mm (to house the 0.15 mm chip with 0.05 mm conductive bump).

Figure 12:
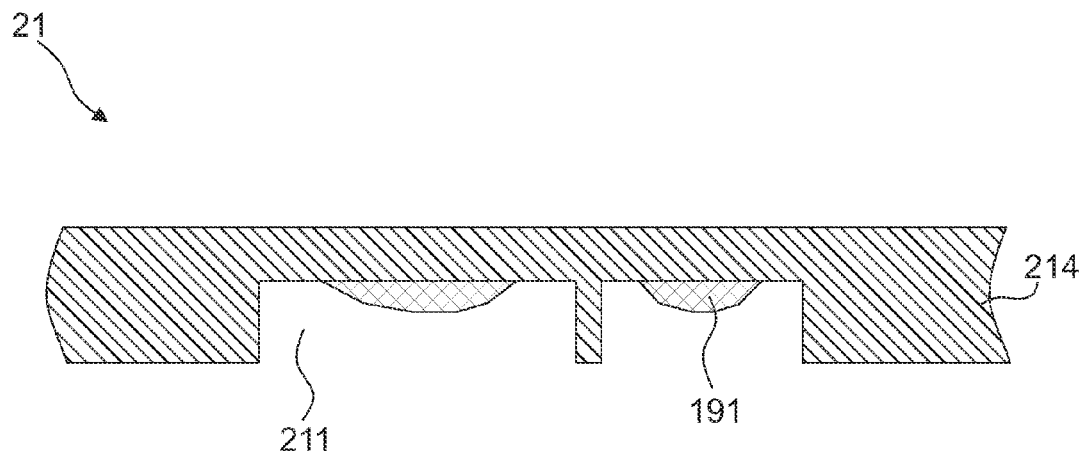
FIGS. 12 and 13 are cross-sectional and bottom perspective views, respectively, showing a state in which an adhesive is dispensed on the heat spreader of FIGS. 10 and 11 in accordance with the first embodiment of the present invention.
Figure 13:
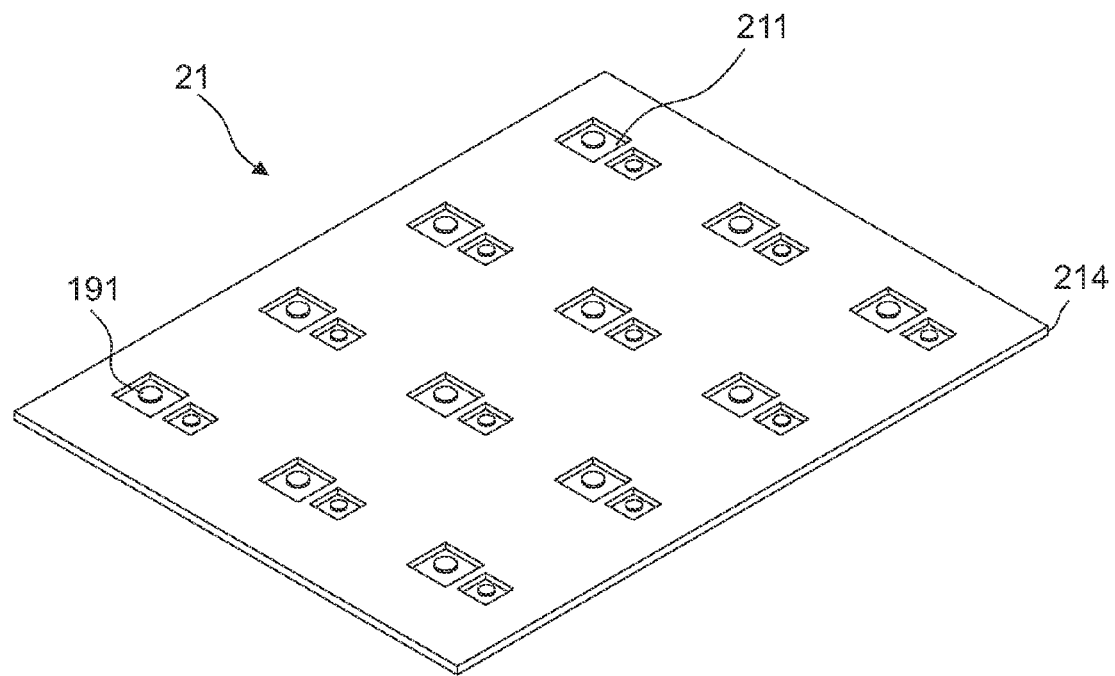

FIGS. 12 and 13 are cross-sectional and bottom perspective views, respectively, of the heat spreader 21 with a thermally conductive material 191 dispensed in the cavities 211. The thermally conductive material 191 typically is a thermally conductive adhesive and dispensed on the bottom of the cavities 211.

Figure 14:
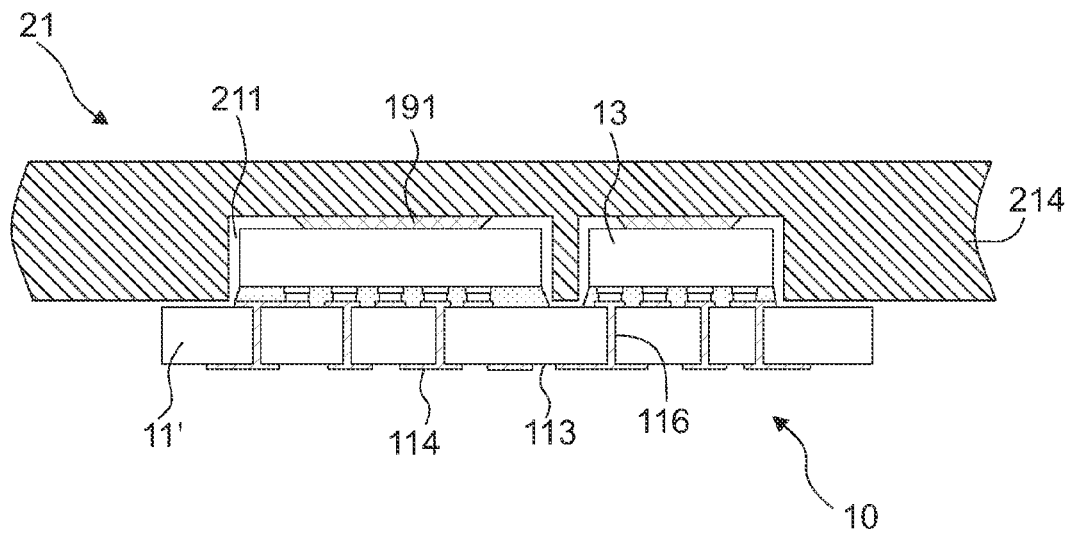
FIGS. 14 and 15 are cross-sectional and bottom perspective views, respectively, showing a state in which the chip-on-interposer subassemblies of FIGS. 8 and 9 are attached to the heat spreader of FIGS. 12 and 13 in accordance with the first embodiment of the present invention.
Figure 15:
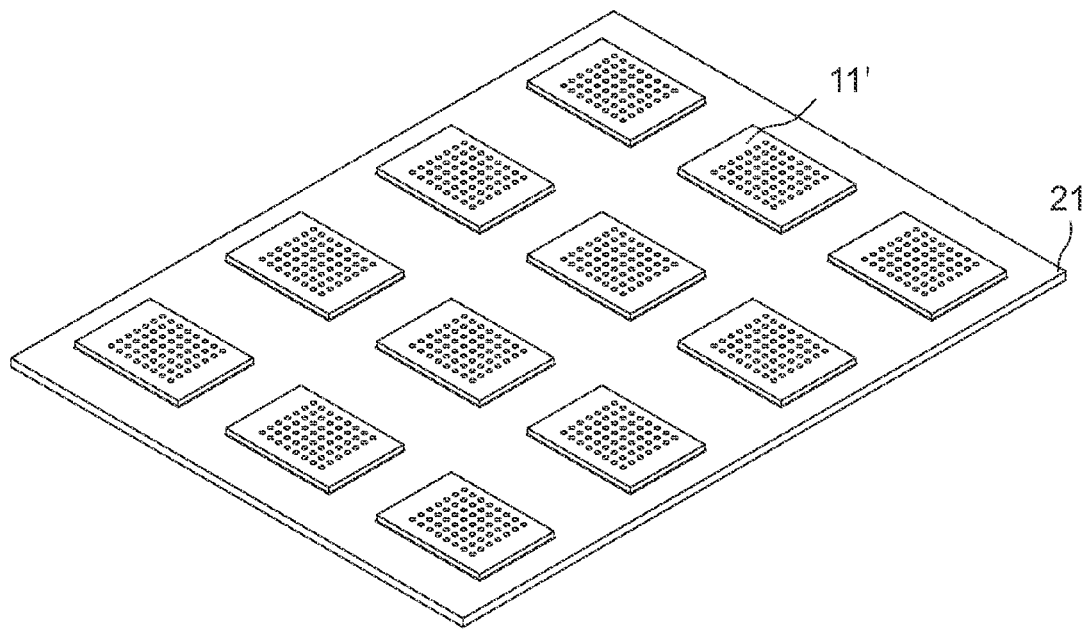

FIGS. 14 and 15 are cross-sectional and bottom perspective views, respectively, of the structure of the chip-on-interposer subassemblies 10 attached to the heat spreader 21 using the thermally conductive material 191. The first chips 13 are inserted into the cavities 211, and the interposers 11' are located beyond the cavities 211 and spaced from the peripheral edges of the heat spreader 21.

Figure 16:
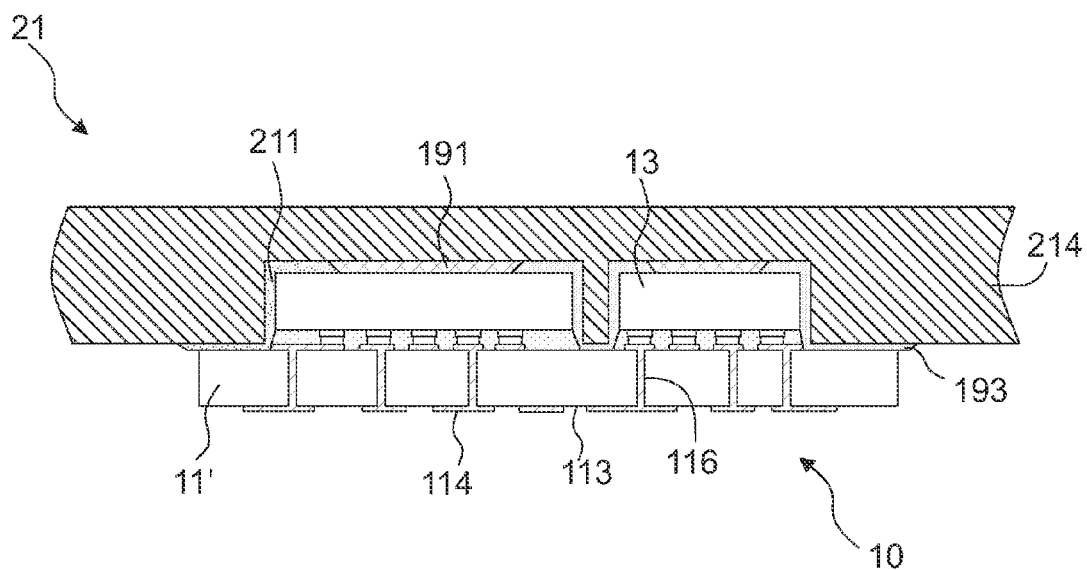
FIGS. 16 and 17 are cross-sectional and bottom perspective views, respectively, showing a state in which the structure of FIGS. 14 and 15 is provided with another adhesive in accordance with the first embodiment of the present invention.
Figure 17:
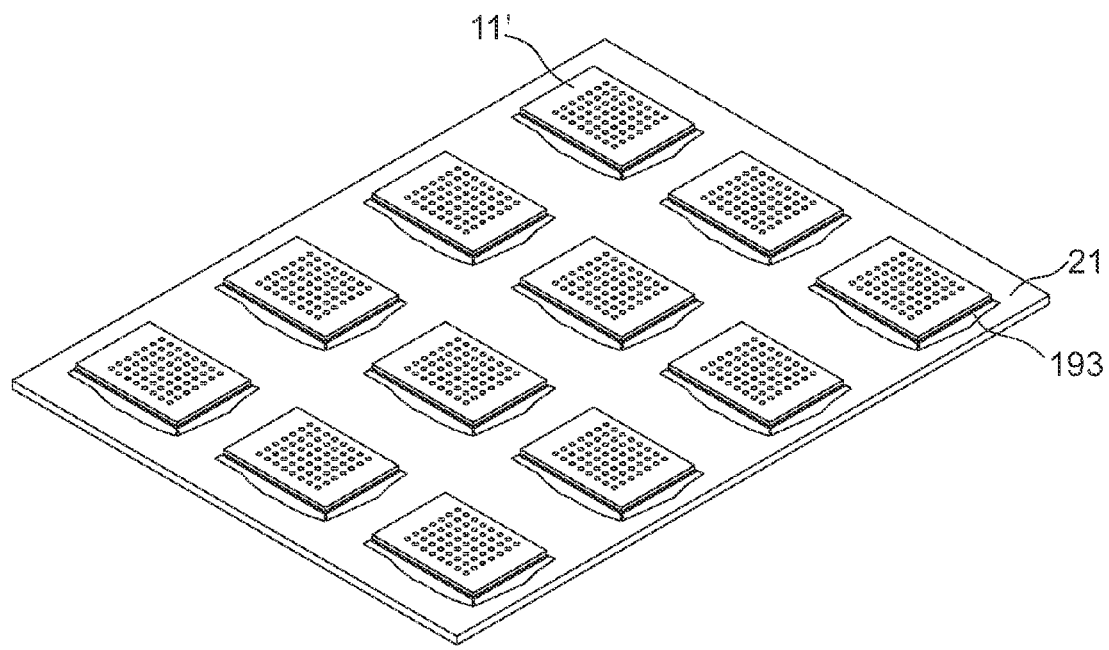

FIGS. 16 and 17 are cross-sectional and bottom perspective views, respectively, of the structure with the adhesive 193 that fills the space between the interposers 11' and the heat spreader 21 and further extends into the cavities 211. The adhesive 193 typically is an electrically insulating underfill and dispensed into the space between the interposers 11' and the heat spreader 21 and the remaining spaces within the cavities 211. As a result, the thermally conductive material 191 provides mechanical bonds and thermal connection between the first chips 13 and the heat spreader 21, and the adhesive 193 provides mechanical bonds between the first chips 13 and the heat spreader 21 and between the interposers 11' and the heat spreader 21.

Figure 18:
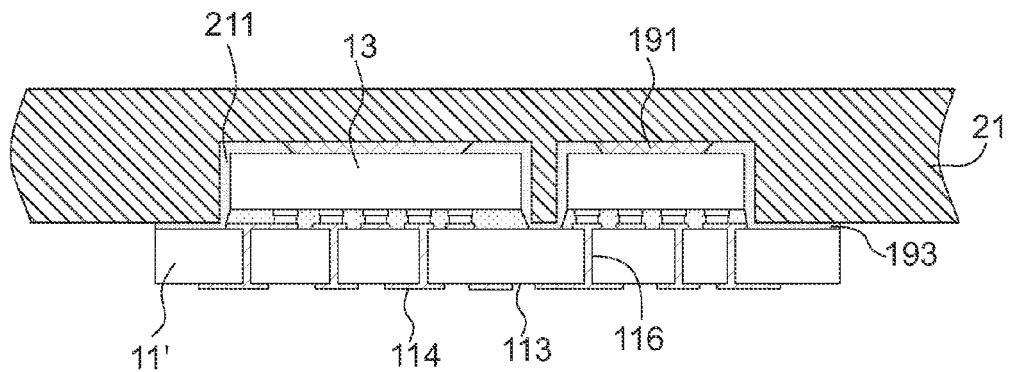
FIGS. 18 and 19 are cross-sectional and bottom perspective views, respectively, showing a state in which excess adhesive is removed from the structure of FIGS. 16 and 17 in accordance with the first embodiment of the present invention.
Figure 19:
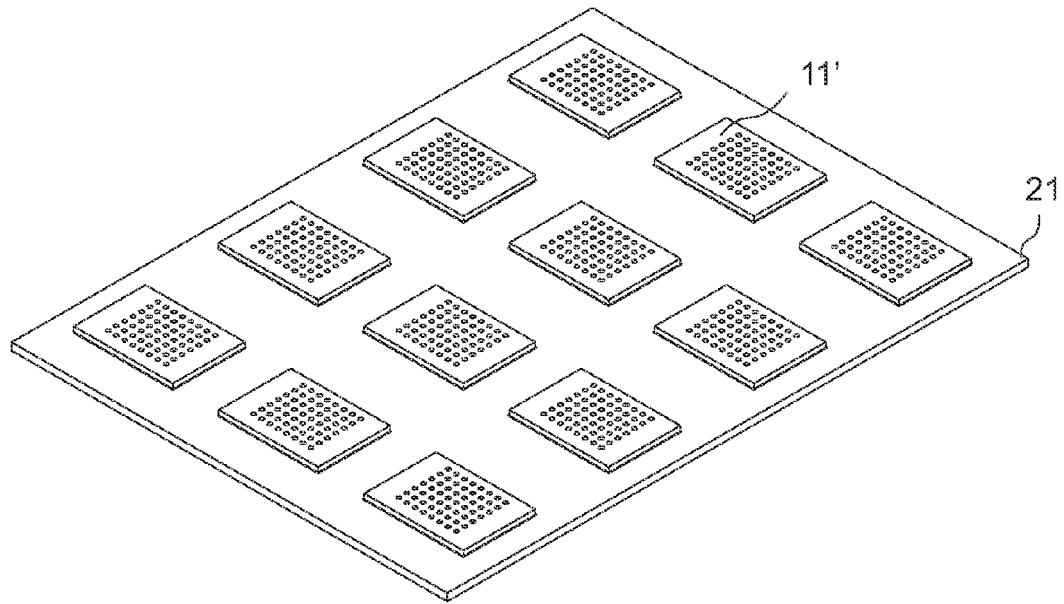

FIGS. 18 and 19 are cross-sectional and bottom perspective views, respectively, of the structure after removal of excess adhesive that flows out of the space between the interposers 11' and the heat spreader 21. As an alternative, the step of removing excess adhesive may be omitted, and the excess adhesive may become a portion of the subsequent balancing layer.

Figure 20:
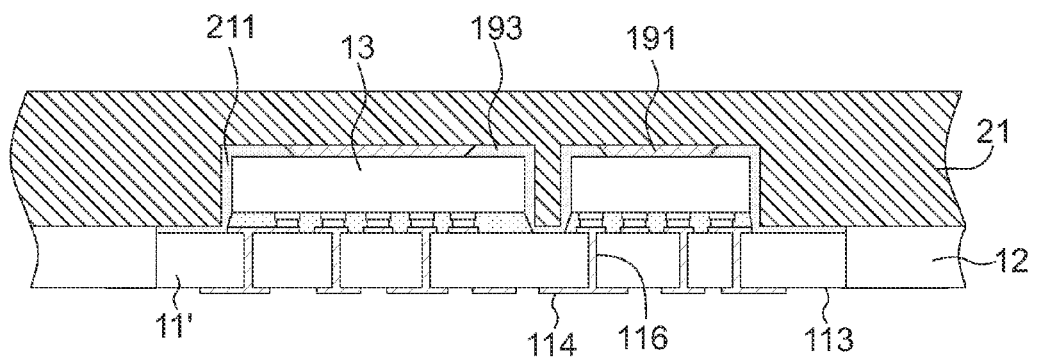
FIGS. 20 and 21 are cross-sectional and bottom perspective views, respectively, showing a state in which a balancing layer is disposed on the structure of FIGS. 18 and 19 in accordance with the first embodiment of the present invention.
Figure 21:
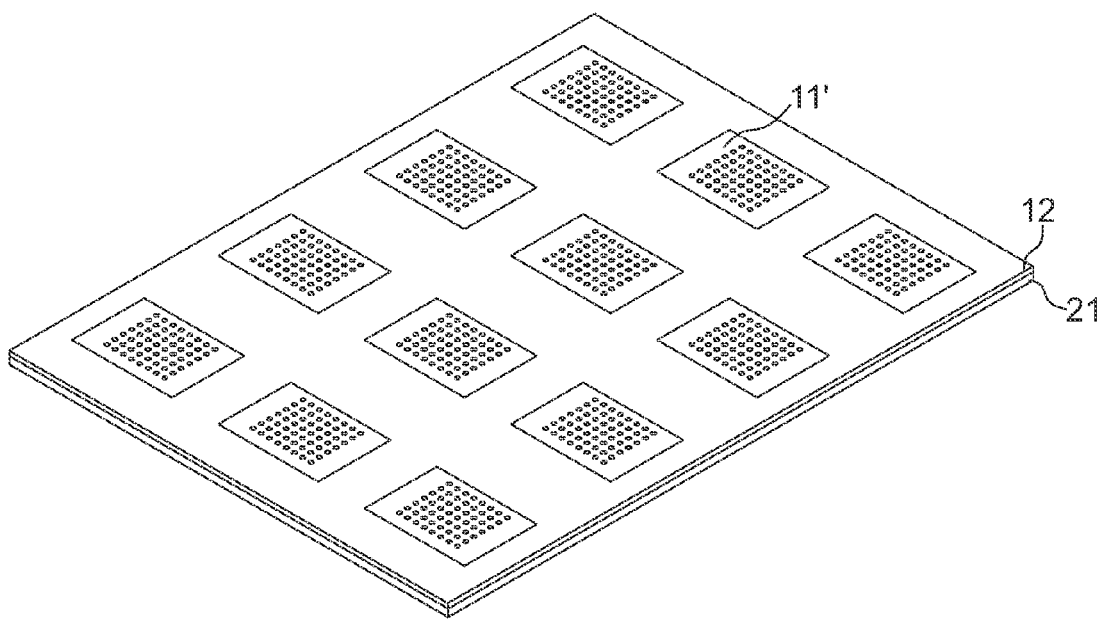

FIGS. 20 and 21 are cross-sectional and bottom perspective views, respectively, of the structure with a balancing layer 12 laminated/coated on the heat spreader 21 in the downward direction. The balancing layer 12 contacts and extends from the heat spreader 21 in the downward direction and laterally covers and surrounds and conformally coats the sidewalls of the interposers 11' and extends laterally from the interposers 11' to the peripheral edges of the structure. In this embodiment, the balancing layer 12 has a thickness of 0.2 mm which is close to the thickness of the interposers 11' and can be made of epoxy resin, glass-epoxy, polyimide, and the like. Also, the step of depositing the balancing layer 12 may be omitted.

FIG. 22 is a cross-sectional view of the structure provided with second chips 14 electrically coupled to the interposer 11'. The second chip 14 includes an active surface 141, an inactive surface 143 opposite to the active surface 141, and I/O pads 142 on the active surface 141. The second chips 14 are electrically coupled to the interposer 11' using bumps 16 that contacts the I/O pads 142 of the second chips 14 and the second contact pads 114 of the interposer 11'. Optionally, underfill 18 can be further provided to fill the gap between the interposer 11' and the second chips 14.

Accordingly, as shown in FIG. 22, a semiconductor device 100 is accomplished and includes an interposer 11', first chips 13, second chips 14, a heat spreader 21, and a balancing layer 12. The first chips 13 are electrically coupled to the first contact pads 112 of the pre-fabricated interposer 11' by flip chip process to form a chip-on-interposer subassembly 10. The chip-on-interposer subassembly 10 is attached to the heat spreader 21 using a thermally conductive material 191 and an adhesive 193 with the first chips 13 positioned within the cavities 211 and the interposer 11' laterally extending beyond the cavities 211. The thermally conductive material 191 provides mechanical bonds and thermal connection between the first chips 13 and the heat spreader 21, and the adhesive 193 provides mechanical bonds between the first chips 13 and the heat spreader 21 and between the interposer 11' and the heat spreader 21. The heat spreader 21 encloses the first chip1 13 within its cavities 211 and laterally extends to the peripheral edges of the device. The balancing layer 12 laterally covers the sidewalls of the interposer 11' and laterally extends to the peripheral edges of the device. The second chips 14 are electrically coupled to the second contact pads 114 of the interposer 11' by flip chip process and thus is further electrically connected to the first chips 13 by the through vias 116 of the interposer 11'. As a result, the interposer 11' can provide fan-out routing/interconnection for the first and second chips 13, 14, and also provide electrical connections between the adjoining first chips 13 and between the adjoining second chips 14.

Embodiment 2

FIGS. 23-42 are schematic views showing a method of making another semiconductor device which further includes an alignment guide for interposer attachment, an interconnect substrate for second level routing and a second heat spreader for heat dissipation of the second chip in accordance with another embodiment of the present invention.

For purposes of brevity, any description in Embodiment 1 above is incorporated herein insofar as the same is applicable, and the same description need not be repeated.

Figure 23:
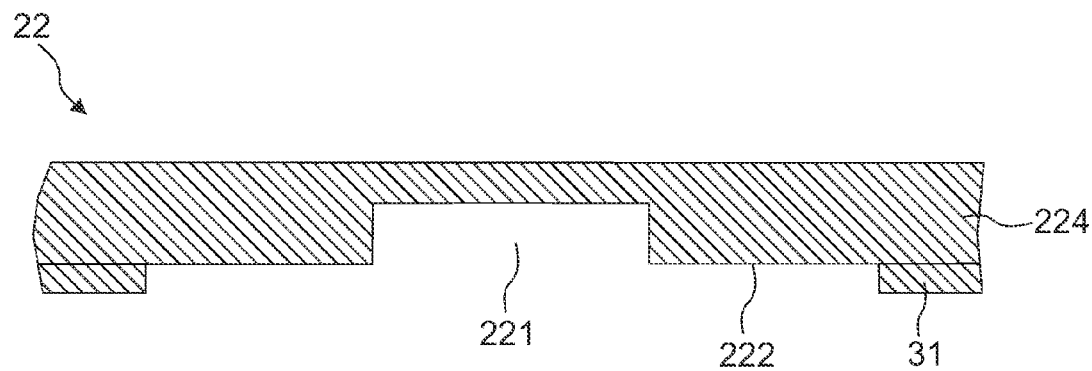
FIG. 23 is a cross-sectional view showing a state in which an alignment guide is formed on a heat spreader in accordance with the second embodiment of the present invention.
Figure 24:
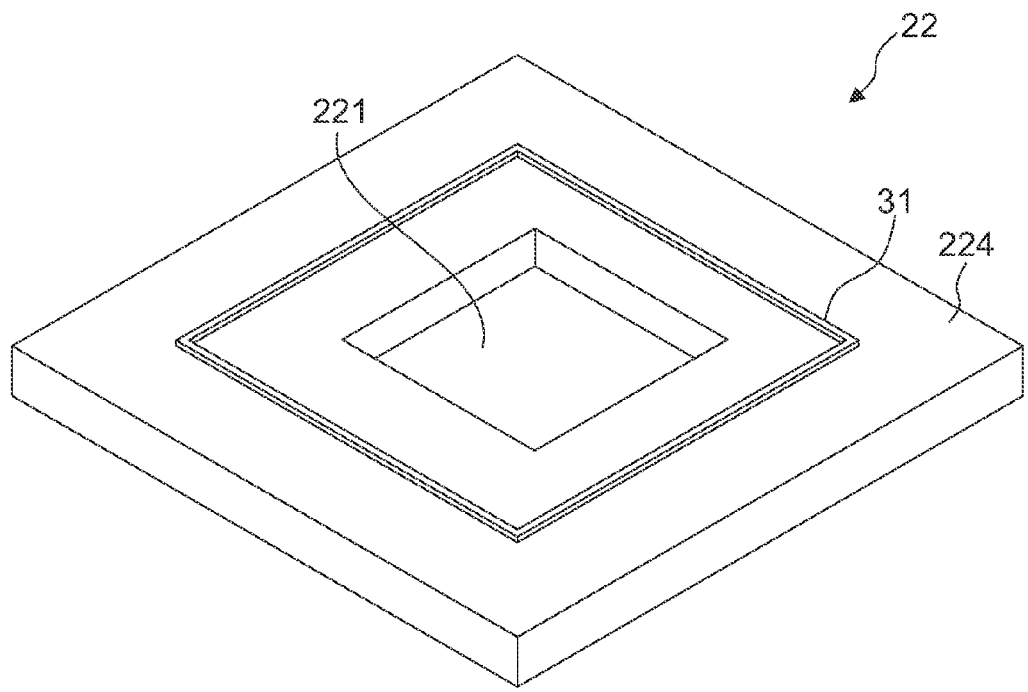
FIG. 24 is a bottom perspective view showing a state in which another aspect of an alignment guide is formed on a heat spreader in accordance with the second embodiment of the present invention.

FIG. 23 is a cross-sectional view of a first heat spreader 22 provided with an alignment guide 31 around its cavity 221. The alignment guide 31 can be formed by removing selected portions of a metal plate 224 or by pattern deposition of a metal or plastic material on the metal plate 224. Plating, etching or mechanical carving is typically used to form the alignment guide 31. Accordingly, the alignment guide 31 extends from the flat surface 222 of the first heat spreader 22 adjacent to the cavity entrance in the downward direction and can have a thickness of 5 to 200 microns. In this embodiment, the alignment guide 31 with a thickness of 50 microns laterally extends to the peripheral edges of the first heat spreader 22 and has inner peripheral edges that conform to the four lateral sides of a subsequently disposed interposer. As an alternative, the alignment guide 31 may be spaced from the peripheral edges of the first heat spreader 22. For instance, FIG. 24 shows another aspect of the alignment guide 31 which is spaced from the peripheral edges of the first heat spreader 22 and has rectangular frame configuration.

Also, the first heat spreader 22 with an alignment guide 31 around its cavity 221 may be fabricated from a laminate substrate. FIGS. 25-30 illustrate a detailed description of this aspect.

Figure 25:
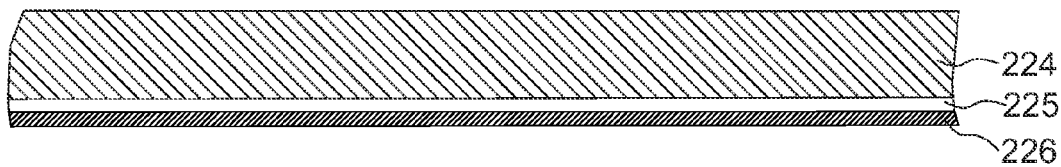
FIG. 25 is a cross-sectional view showing a laminate substrate in accordance with the second embodiment of the present invention.

FIG. 25 is a cross-sectional view of a laminate substrate that includes a metal plate 224, a dielectric layer 225 and a metal layer 226. The dielectric layer 225 is sandwiched between the metal plate 224 and the metal layer 226. The dielectric layer 225 typically is made of epoxy resin, glass-epoxy, polyimide, and the like, and has a thickness of 50 microns. The metal layer 226 typically is made of copper, but copper alloys or other materials (such as aluminum, stainless steel or their alloys) may also be used. The thickness of the metal layer 226 can range from 5 to 200 microns. In this embodiment, the metal layer 226 is a copper plate with a thickness of 50 microns.

Figure 26:
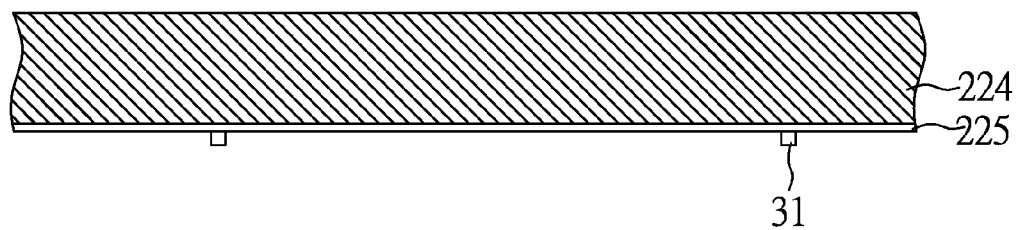
FIGS. 26 and 27 are cross-sectional and bottom perspective views, respectively, showing a state in which the laminate substrate of FIG. 25 is processed to form an alignment guide in accordance with the second embodiment of the present invention.
Figure 27:
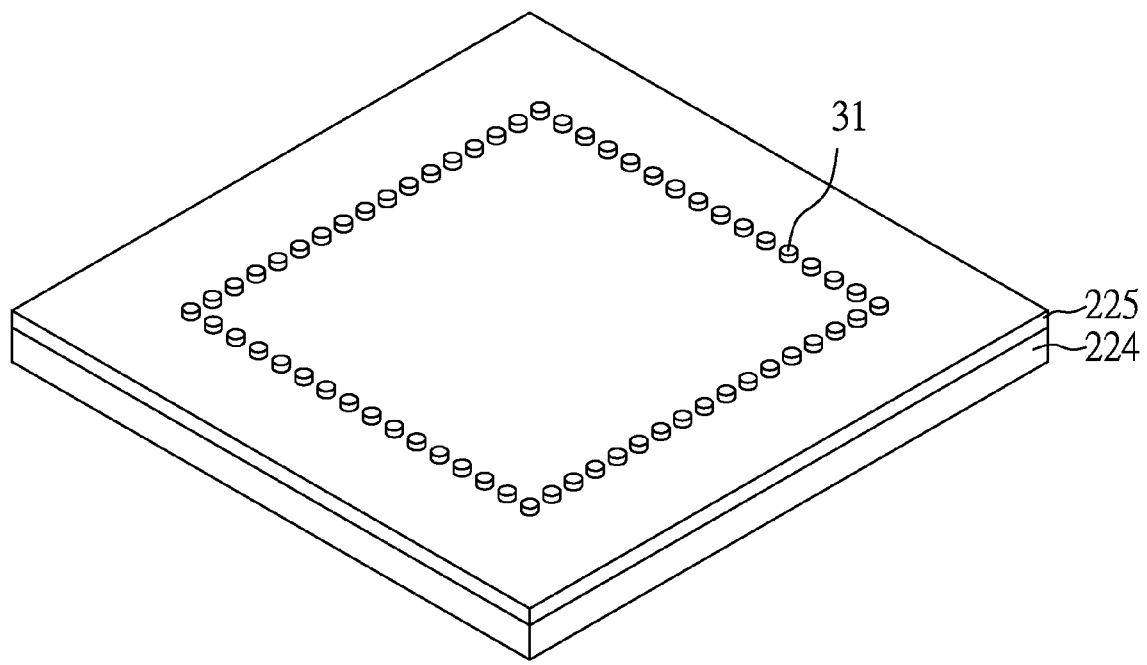

FIGS. 26 and 27 are cross-sectional and bottom perspective views, respectively, of the structure with an alignment guide 31 formed on the dielectric layer 225. The alignment guide 31 can be formed by removing selected portions of the metal layer 226 using photolithography and wet etching. As shown in FIG. 27, the alignment guide 31 consists of plural metal posts in a rectangular frame array conforming to four lateral sides of a subsequently disposed interposer. However, the alignment guide patterns are not limited thereto and can be in other various patterns against undesirable movement of the subsequently disposed interposer. For instance, the alignment guide 31 may consist of a continuous or discontinuous strip and conform to four sides, two diagonal corners or four corners of a subsequently disposed interposer.

Figure 28:
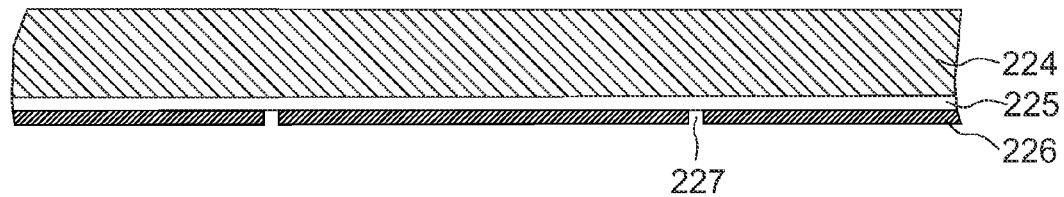
FIG. 28 is a cross-sectional view showing a laminate substrate with openings in accordance with the second embodiment of the present invention.
Figure 29:
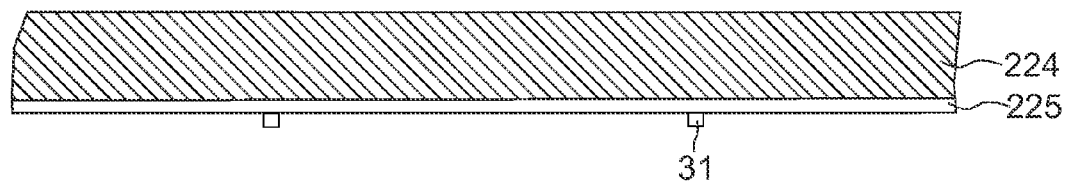
FIG. 29 is a cross-sectional view showing a state in which the laminate substrate of FIG. 28 is processed to form an alignment guide in accordance with the second embodiment of the present invention.

FIGS. 28 and 29 are cross-sectional views showing an alternative process of forming an alignment guide on a dielectric layer of a laminate substrate.

FIG. 28 is a cross-sectional view of a laminate substrate with a set of openings 227. The laminate substrate includes a metal plate 224, a dielectric layer 225 and a metal layer 226 as mentioned above, and the openings 227 are formed by removing selected portions of the metal layer 226.

FIG. 29 is a cross-sectional view of the structure with the alignment guide 31 formed on the dielectric layer 225. The alignment guide 31 can be formed by dispensing or printing a photosensitive plastic material (e.g., epoxy, polyimide, etc.) or non-photosensitive material into the openings 227, followed by removing the entire metal layer 226. Accordingly, the alignment guide 31 consists of plural resin posts and has a pattern against undesirable movement of a subsequently disposed interposer.

Figure 30:
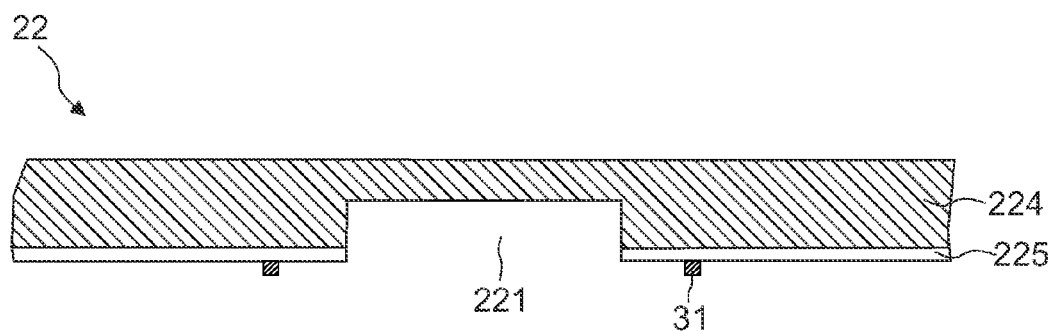
FIG. 30 is a cross-sectional view showing a state in which the laminate substrate of FIG. 26 is provided with a cavity to finish the fabrication of another aspect of a heat spreader in accordance with the second embodiment of the present invention.

FIG. 30 is a cross-sectional view of the structure with a cavity 221 formed in the laminate substrate. The cavity 221 extends through the dielectric layer 225 and further extends into the metal plate 224. As a result, the first heat spreader 22 is formed to include a metal plate 224, a dielectric layer 225 and a cavity 221, and the alignment guide 31 is positioned around the entrance of the cavity 221.

Figure 31:
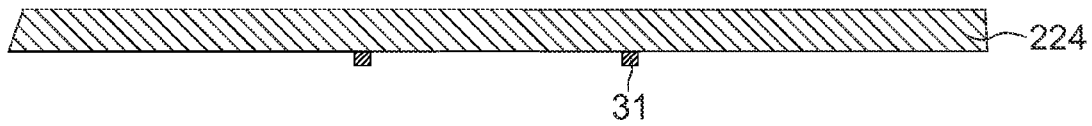
FIG. 31 is a cross-sectional view showing a state in which an alignment guide is formed on a metal plate in accordance with the second embodiment of the present invention.
Figure 32:
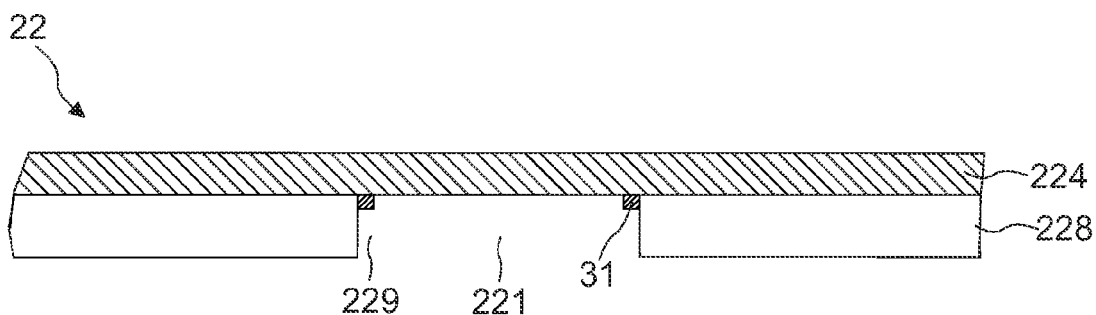
FIG. 32 is a cross-sectional view showing a state in which a base layer is disposed on the structure of FIG. 31 to finish the fabrication of yet another aspect of a heat spreader in accordance with the second embodiment of the present invention.

Additionally, the alignment guide may be formed within the cavity of the first heat spreader by another process as illustrated in FIGS. 31 and 32.

FIG. 31 is a cross-sectional view of the structure with an alignment guide 31 formed on a metal plate 224 which typically is a copper sheet with a thickness of 1 mm. The alignment guide 31 can be formed by removing selected portions of the metal plate 224 or by pattern deposition of a metal or plastic material on the metal plate 224. In this embodiment, the alignment guide 31 consists of plural metal posts in a rectangular frame arrangement conforming to four sides of a subsequently disposed chip. However, the alignment guide patterns are not limited thereto and can be in other various patterns against undesirable movement of the subsequently disposed chip.

FIG. 32 is a cross-sectional view of the structure provided with a base layer 228. The base layer 228 is laminated onto the metal plate 224 with the alignment guide 31 aligned with and inserted into an aperture 229 of the base layer 228. The base layer 228 can be made of epoxy, BT, polyimide and other kinds of resin or resin/glass composite. As a result, the first heat spreader 22 is formed to include a metal plate 224, a base layer 228 and a cavity 221 (corresponding to the aperture 229 of the base layer 228), and the alignment guide 31 is located on the bottom of the cavity 221.

Hereafter, the first heat spreader 22 shown in FIG. 23 is used for detailed description of the following steps. However, it is apparent that other aspects of the first heat spreader mentioned above also may be practiced or applied in the following steps.

Figure 33:
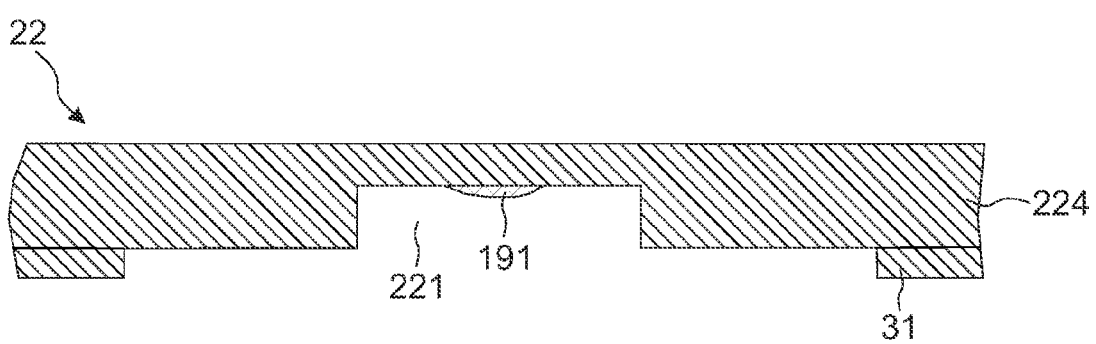
FIG. 33 is a cross-sectional view showing a state in which an adhesive is dispensed on the heat spreader of FIG. 23 in accordance with the second embodiment of the present invention.

FIG. 33 is a cross-sectional view of the first heat spreader 22 with a thermally conductive material 191 dispensed in the cavity 221. The thermally conductive material 191 typically is a thermally conductive adhesive and dispensed on the cavity bottoms.

Figure 34:
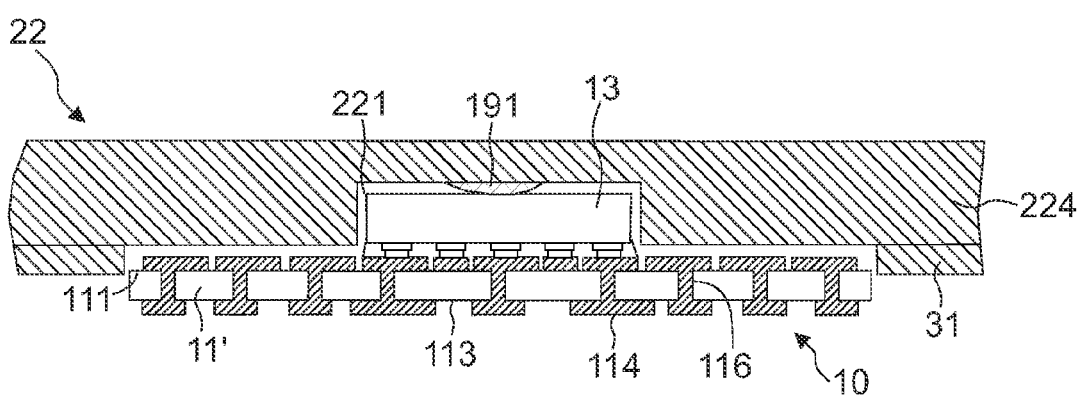
FIG. 34 is a cross-sectional view showing a state in which a chip-on-interposer subassembly is attached to the heat spreader of FIG. 33 in accordance with the second embodiment of the present invention.

FIG. 34 is a cross-sectional view of the structure with a chip-on-interposer subassembly 10 attached to the first heat spreader 22 using the thermally conductive material 191. The chip-on-interposer subassembly 10 is similar to that illustrated in FIG. 8, except that a single first chip 13 is flip mounted on the interposer 11' in this illustration. The interposer 11' and the first chip 13 are attached to the first heat spreader 22 with the first chip 13 inserted into the cavity 221 and the alignment guide 31 laterally aligned with and in close proximity to the peripheral edges of the interposer 11'. The interposer placement accuracy is provided by the alignment guide 31. The alignment guide 31 extends beyond the first surface 111 of the interposer 11' in the downward direction and is located beyond and laterally aligned with the four lateral surfaces of the interposer 11' in the lateral directions. As the alignment guide 31 is in close proximity to and conforms to the four lateral surfaces of the interposer 11' in lateral directions, any undesirable movement of the chip-on-interposer subassembly 10 due to adhesive curing can be avoided. Preferably, a gap in between the interposer 11' and the alignment guide 31 is in a range of about 5 to 50 microns. Also, the attachment of the chip-on-interposer subassembly 10 may be executed without the alignment guide 31.

Figure 35:
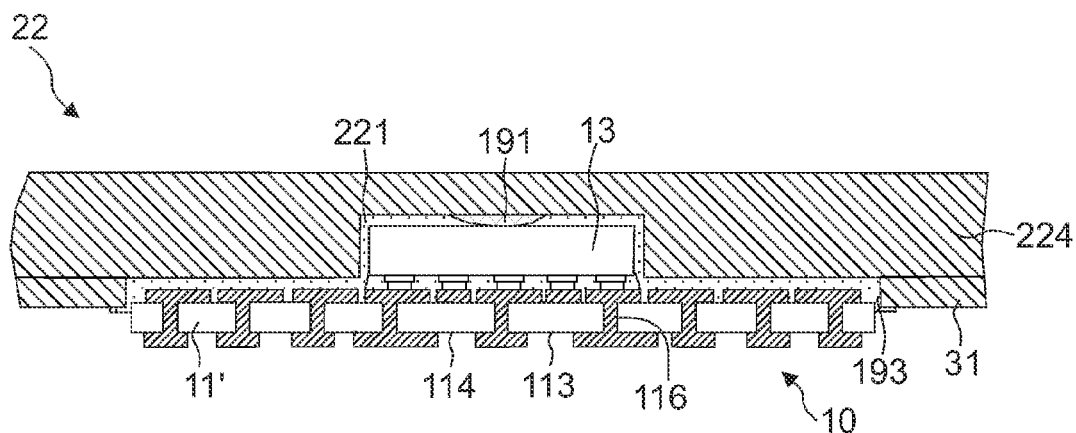
FIG. 35 is a cross-sectional view showing a state in which the structure of FIG. 34 is provided with another adhesive in accordance with the second embodiment of the present invention.

FIG. 35 is a cross-sectional view of the structure with an adhesive 193 that fills the space between the interposer 11' and the first heat spreader 22 and further extends into the cavity 221. The adhesive 193 typically is an electrically insulating underfill and dispensed into the space between the interposer 11' and the first heat spreader 22 and the remaining space within the cavity 221.

Figure 36:
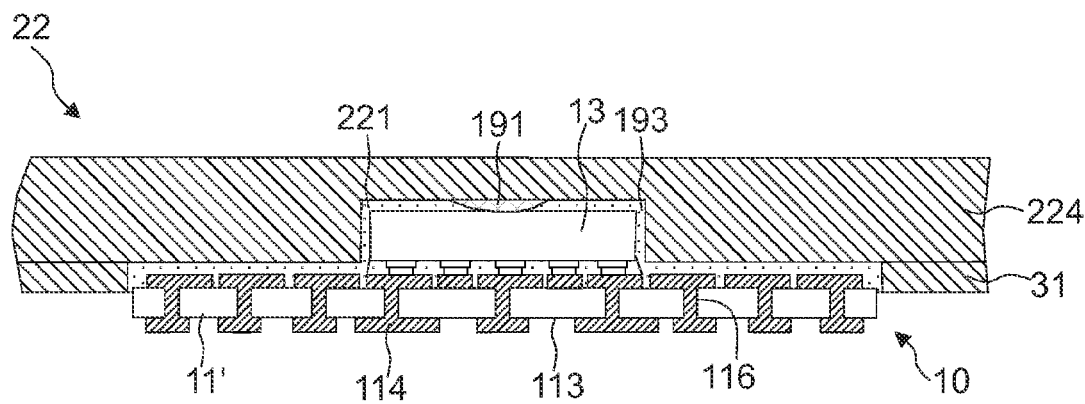
FIG. 36 is a cross-sectional view showing a state in which excess adhesive is removed from the structure of FIG. 35 in accordance with the second embodiment of the present invention.

FIG. 36 is a cross-sectional view of the structure after removal of excess adhesive that overflows onto the alignment guide 31. As an alternative, the step of removing excess adhesive may be omitted, and the excess adhesive becomes a portion of the subsequent balancing layer.

Figure 37:
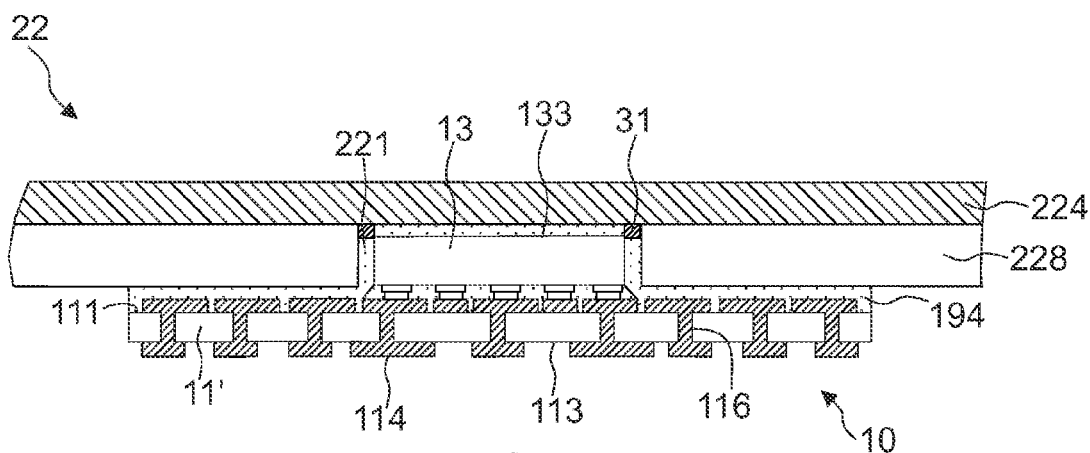
FIG. 37 is a cross-sectional view showing a state in which a chip-on-interposer subassembly is attached to the heat spreader of FIG. 32 in accordance with the second embodiment of the present invention.

As another aspect, FIG. 37 shows a cross-sectional view of the structure with the chip-on-interposer subassembly 10 attached to the first heat spreader 22 illustrated in FIG. 32 using a thermally conductive material 194. The first chip 13 is positioned within the cavity 221 with the alignment guide 31 laterally aligned with peripheral edges of the first chip 13, and the interposer 11' is located beyond the cavity 221 with its first surface 111 attached on the base layer 228. The first chip 13 is attached to the first heat spreader 22 by dispensing the thermally conductive material 194 on the cavity bottoms, and then inserting the first chip 13 of the chip-on-interposer subassembly 10 into the cavity 221. The thermally conductive material 194 (typically a thermally conductive but electrically insulating adhesive) within the cavity 221 is compressed by the first chip 13, flows downward into the gaps between the first chip 13 and the cavity sidewalls, and overflows onto the base layer 228. As a result, the thermally conductive material 194 surrounds the embedded first chip 13, and the squeezed out portion contacts and is sandwiched between the first surface 111 of the interposer 11' and the base layer 228. The alignment guide 31 extends from the bottom of the cavity 221 and extends beyond the inactive surface 133 of the first chip 13 in the downward direction and is in close proximity to the peripheral edges of the first chip 13 to provide critical placement accuracy for the chip-on-interposer subassembly 10.

Figure 38:
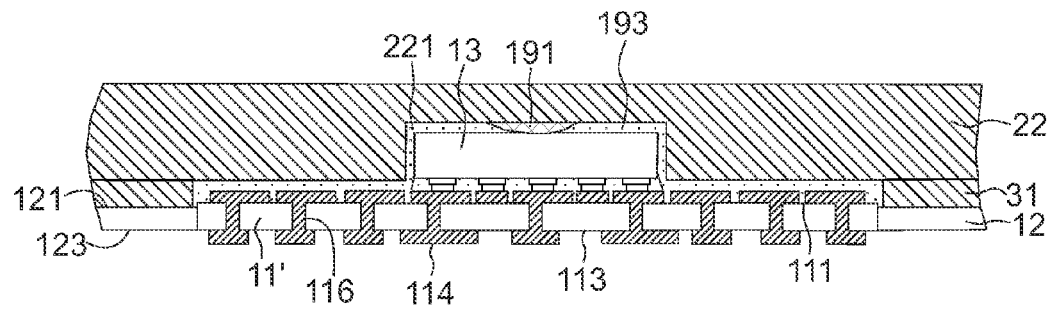
FIG. 38 is a cross-sectional view showing a state in which a balancing layer is disposed on the structure of FIG. 36 in accordance with the second embodiment of the present invention.

FIG. 38 is a cross-sectional view of the structure with a balancing layer 12 laminated/coated on the alignment guide 31. The balancing layer 12 contacts and extends from the alignment guide 31 in the downward direction and laterally covers and surrounds and conformally coats the sidewalls of the interposer 11' and extends laterally from the interposer 11' to the peripheral edges of the structure. As a result, the balancing layer 12 has a first surface 121 in contact with the alignment guide 31 and the adhesive 193 and a second surface 123 flush with the second surface 113 of the interposer 11'.

Figure 39:
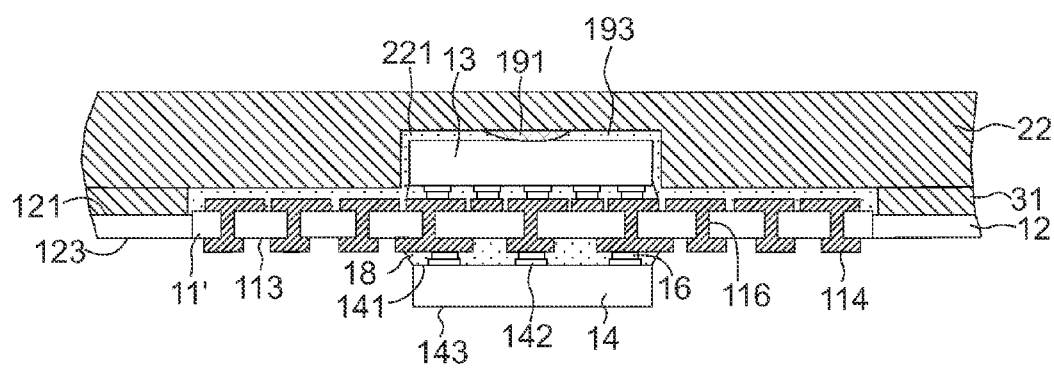
FIG. 39 is a cross-sectional view showing a state in which another chip is mounted on the structure of FIG. 38 in accordance with the second embodiment of the present invention.

FIG. 39 is a cross-sectional view of the structure with a second chip 14 mounted on the second surface 113 of the interposer 11' using bumps 16. The second chip 14 includes an active surface 141, an inactive surface 143 opposite to the active surface 141, and I/O pads 142 on the active surface 141. The bumps 16 contact the I/O pads 142 of the second chip 14 and the second contact pads 114 of the interposer 11'. As a result, the second chip 14 is electrically coupled to the second contact pads 114 of the interposer 11' by the bumps 16 and is further electrically connected to the first chip 13 by the through vias 116 of the interposer 11'. Optionally, underfill 18 can be further provided to fill the gap between the interposer 11' and the second chip 14.

Figure 40:
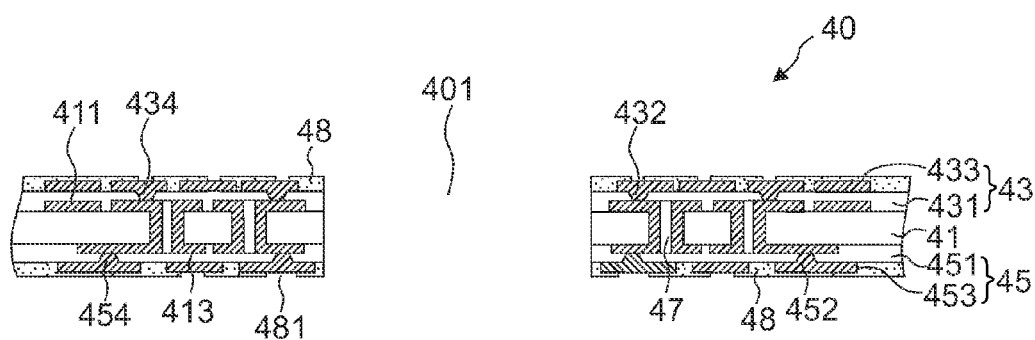
FIG. 40 is a cross-sectional view of an interconnect substrate in accordance with the second embodiment of the present invention.

FIG. 40 is a cross-sectional view of an interconnect substrate 40 having a through opening 401. The interconnect substrate 40 includes a core layer 41, top and bottom buildup circuitries 43, 45, plated through holes 47 and solder mask layers 48. The top and bottom buildup circuitries 43, 45 are respectively disposed on both sides of the core layer 41, and each of them includes an insulating layer 431, 451 and conductive traces 433, 453. The insulating layers 431, 451 respectively cover both sides of the core layer 41 in the upward and downward directions, and the conductive traces 433, 453 respectively extend laterally on the insulating layers 431, 451 and extend through via openings 432, 452 in the insulating layers 431, 451 to form conductive vias 434, 454 in contact with top and bottom patterned wiring layers 411, 413 of the core layer 41. The plated through holes 47 extend through the core layer 41 to provide electrical connections between the top and bottom buildup circuitries 43, 45. The solder mask layers 48 covers the top and bottom buildup circuitries 43, 45 in the upward and downward direction, and include solder mask openings 481 to expose selected portions of the conductive traces 433, 453. The through opening 401 extends through the interconnect substrate 40 and has a dimension that is almost the same or a little larger than the second chip 14.

Figure 41:
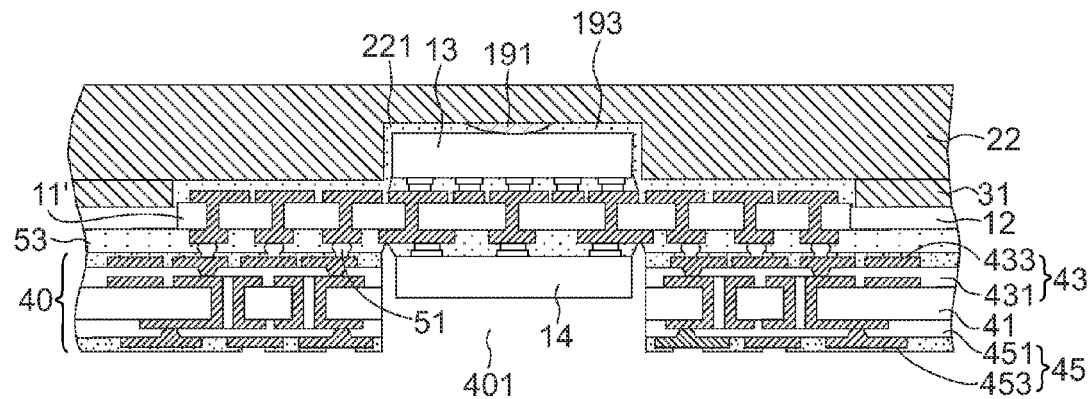
FIG. 41 is a cross-sectional view showing a state in which the interconnect substrate of FIG. 40 is mounted on the structure of FIG. 39 in accordance with the second embodiment of the present invention.

FIG. 41 is a cross-sectional view of the structure with the interconnect substrate 40 electrically coupled to the interposer 11'. The second chip 14 is inserted into the through opening 401 of the interconnect substrate 40, and the interconnect substrate 40 is electrically coupled to the interposer 11' by solder balls 51 that contact the second contact pads 114 of the interposer 11' and the top buildup circuitry 43 of the interconnect substrate 40. Optionally, underfill 53 can be further provided to fill the gap between the interposer 11' and the interconnect substrate 40 and between the balancing layer 12 and the interconnect substrate 40.

Figure 42:
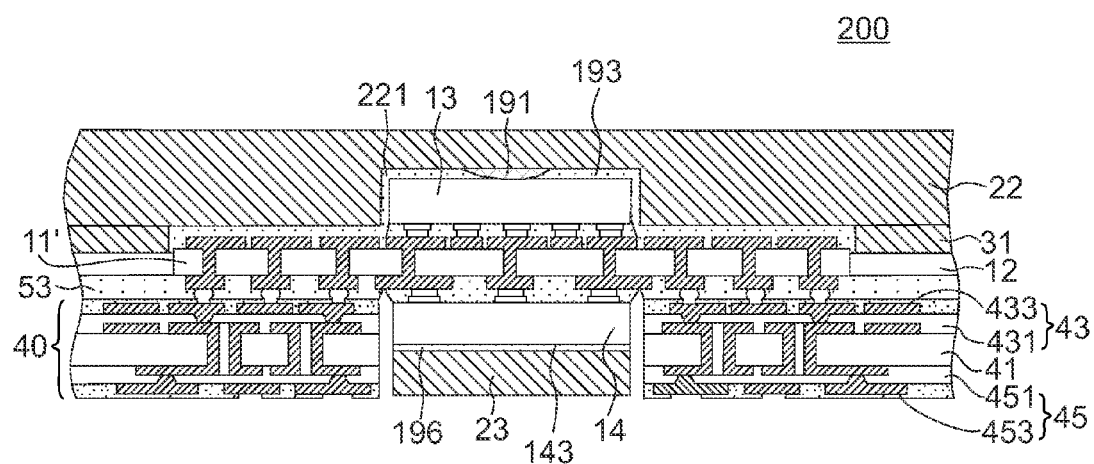
FIG. 42 is a cross-sectional view showing a state in which another heat spreader is mounted on the structure of FIG. 41 to finish the fabrication of a semiconductor device in accordance with the second embodiment of the present invention.

FIG. 42 is a cross-sectional view of the structure with a second heat spreader 23 attached to the second chip 14. The second heat spreader 23 is mounted on the inactive surface 143 of the second chip 14 using a thermally conductive material 196 (typically a thermally conductive adhesive). The second heat spreader 23 can be made of copper, aluminum, stainless steel or their alloys. In this embodiment, the second heat spreader 23 is a copper sheet with a thickness of 1 mm.

Accordingly, as shown in FIG. 42, a semiconductor device 200 is accomplished and includes an interposer 11', a first chip 13, a second chip 14, a balancing layer 12, a first heat spreader 22, a second heat spreader 23, an alignment guide 31 and an interconnect substrate 40. The first chip 13 is electrically coupled to first contact pads 112 of the pre-fabricated interposer 11' by flip chip process to form a chip-on-interposer subassembly 10. The chip-on-interposer subassembly 10 is attached to the first heat spreader 22 using a thermally conductive material 191 and an adhesive 193 with the first chip 13 positioned within the cavity 221 and the interposer 11' laterally extending beyond the cavity 221. The thermally conductive material 191 provides mechanical bonds and thermal connection between the first chip 13 and the first heat spreader 22, and the adhesive 193 provides mechanical bonds between the first chip 13 and the first heat spreader 22 and between the interposer 11' and the first heat spreader 22. The first heat spreader 22 encloses the first chip 13 within its cavity 221 and laterally extends to the peripheral edges of the device. The alignment guide 31 extends from the first heat spreader 22 and extends beyond the first surface 111 of the interposer 11' in the downward direction and is in close proximity to the peripheral edges of the interposer 11' to provide critical placement accuracy for the interposer 11'. The second chip 14 is electrically coupled to second contact pads 114 of the interposer 11' by flip chip process and thus is electrically connected to the first chip 13 by the through vias 116 of the interposer 11'. The balancing layer 12 laterally covers the sidewalls of the interposer 11' and laterally extends to the peripheral edges of the device, and the second surface 123 of the balancing layer 12 is essentially coplanar with the second surface 113 of the interposer 11'. The interconnect substrate 40 is electrically coupled to the second contact pads 114 of the interposer 11' by solder balls 51 to provide second level routing. The second heat spreader 23 is attached on the second chip 14 using a thermally conductive material 196 so as to dissipate heat from the second chip 14.

Embodiment 3

FIGS. 43-50 are schematic views showing a method of making yet another semiconductor device in which the second chip is enclosed in a cavity of a second heat spreader that laterally extends to the peripheral edges of the device in accordance with yet another embodiment of the present invention.

For purposes of brevity, any description in the aforementioned Embodiments is incorporated herein insofar as the same is applicable, and the same description need not be repeated.

Figure 43:
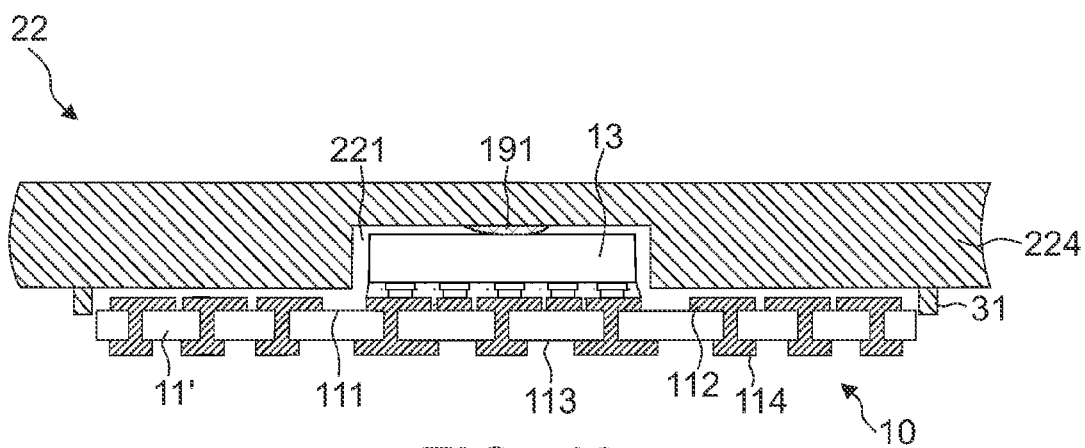
FIG. 43 is a cross-sectional view showing a state in which a chip-on-interposer subassembly is attached to the heat spreader of FIG. 24 using an adhesive in accordance with the third embodiment of the present invention.

FIG. 43 is a cross-sectional view of the structure with a chip-on-interposer subassembly 10 attached to the first heat spreader 22 of FIG. 24 using a thermally conductive material 191. The interposer 11' and the first chip 13 are attached to the first heat spreader 22 with the first chip 13 inserted into the cavity 221 and the alignment guide 31 laterally aligned with and in close proximity to the peripheral edges of the interposer 11'. The thermally conductive material 191 contacts the cavity bottoms and the first chip 13, thereby providing mechanical bonds and thermal connection between the first chip 13 and the first heat spreader 22. The alignment guide 31 extends beyond the first surface 111 of the interposer 11' in the downward direction and is in close proximity to the peripheral edges of the interposer 11' to provide critical placement accuracy for the interposer 11'.

Figure 44:
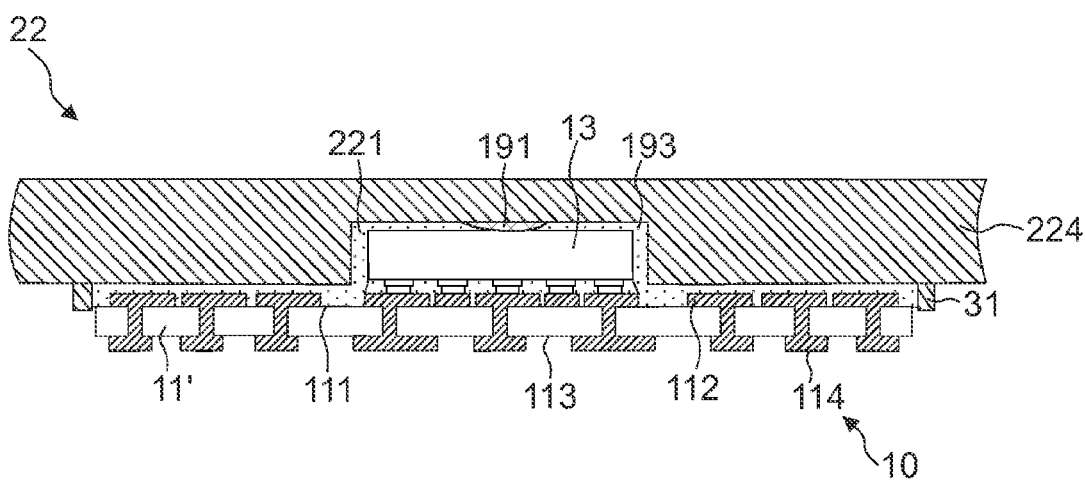
FIG. 44 is a cross-sectional view showing a state in which the structure of FIG. 43 is provided with another adhesive in accordance with the third embodiment of the present invention.

FIG. 44 is a cross-sectional view of the structure with an adhesive 193 that fills the space between the interposer 11' and the first heat spreader 22 and further extends into the cavity 221. The adhesive 193 typically is an electrically insulating underfill and dispensed into the space between the interposer 11' and the first heat spreader 22 and the remaining space within the cavity 221.

Figure 45:
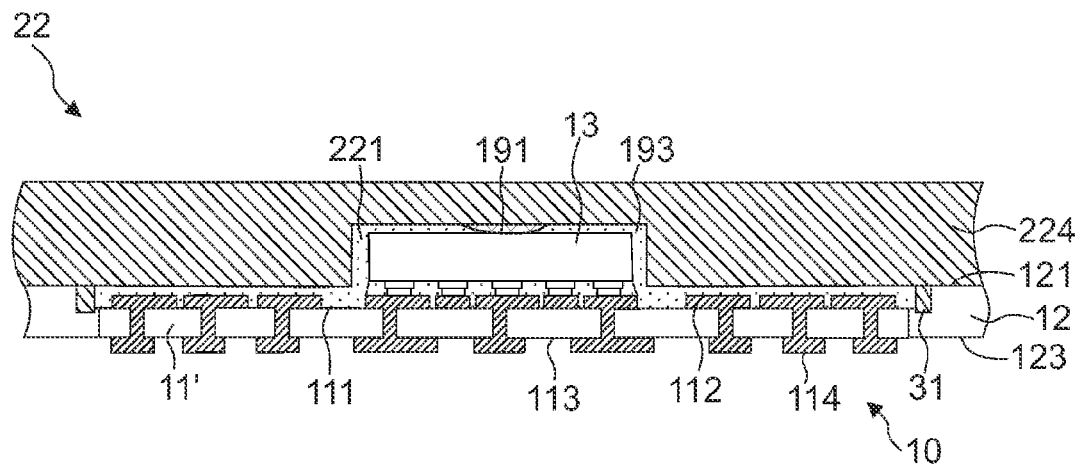
FIG. 45 is a cross-sectional view showing a state in which a balancing layer is disposed on the structure of FIG. 44 in accordance with the third embodiment of the present invention.

FIG. 45 is a cross-sectional view of the structure with a balancing layer 12 laminated/coated on the first heat spreader 22 and the alignment guide 31. The balancing layer 12 contacts and extends from the first heat spreader 22 and the alignment guide 31 in the downward direction, laterally covers and surrounds and conformally coats the sidewalls of the interposer 11' and extends laterally from the interposer 11' to the peripheral edges of the structure. As a result, the balancing layer 12 has a first surface 121 in contact with the first heat spreader 22 and a second surface 123 flush with the second surface 113 of the interposer 11'.

Figure 46:
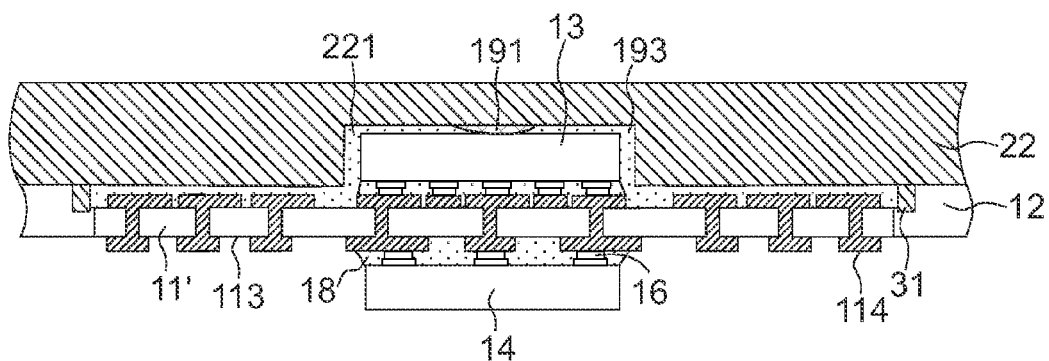
FIG. 46 is a cross-sectional view showing a state in which another chip is mounted on the structure of FIG. 45 in accordance with the third embodiment of the present invention.

FIG. 46 is a cross-sectional view of the structure with a second chip 14 mounted on the second surface 113 of the interposer 11'. The second chip 14 is electrically coupled to the second contact pads 114 of the interposer 11' using bumps 16. Optionally, underfill 18 can be further provided to fill the gap between the interposer 11' and the second chip 14.

Figure 47:
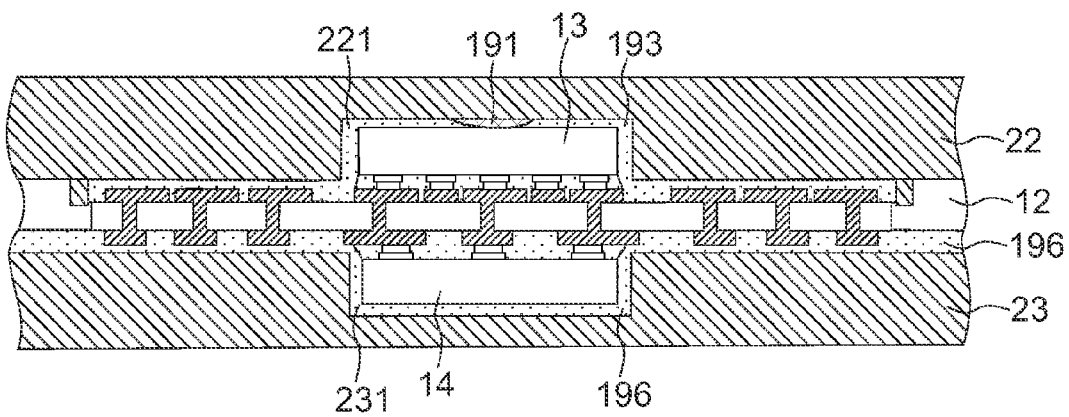
FIG. 47 is a cross-sectional view showing a state in which another heat spreader is mounted on the structure of FIG. 46 in accordance with the third embodiment of the present invention.

FIG. 47 shows a cross-sectional view of the structure with a second heat spreader 23 that includes a cavity 231 and covers the second chip 14, the interposer 11' and the balancing layer 12 from below. The second heat spreader 23 is attached to the second surface 113 of the interposer 11' and the second surface 123 of the balancing layer 12 by dispensing the thermally conductive material 196 on the cavity bottoms of the second heat spreader 23, and then inserting the second chip 14 into the cavity 231. The thermally conductive material 196 (typically a thermally conductive but electrically insulating adhesive) within the cavity 231 is compressed by the second chip 14, flows upward into the gaps between the second chip 14 and the cavity sidewalls, and overflows onto the interposer 11' and the balancing layer 12. As a result, the thermally conductive material 196 surrounds the embedded second chip 14, and the squeezed out portion contacts and is sandwiched between the second surface 113 of the interposer 11' and the second heat spreader 23 and between the second surface 123 of the balancing layer 12 and the second heat spreader 23.

Figure 48:
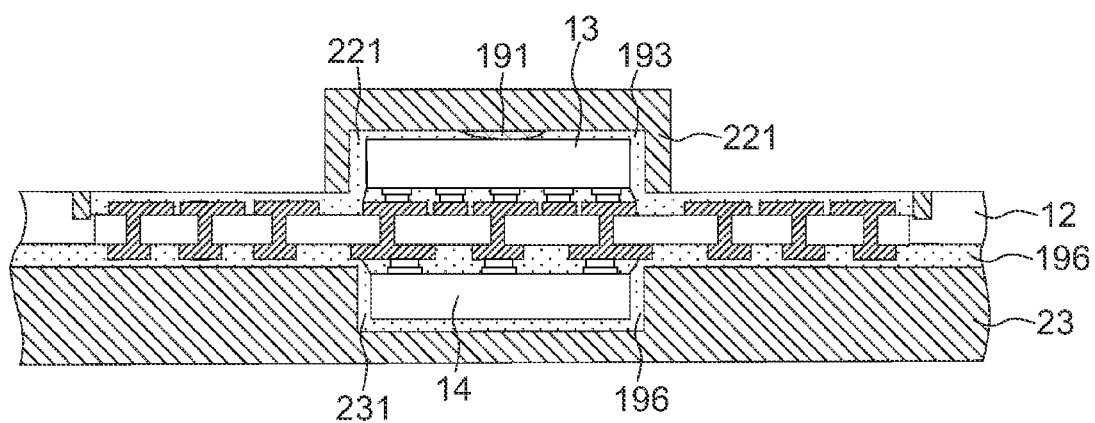
FIG. 48 is a cross-sectional view showing a state in which the upper heat spreader of FIG. 47 is selectively removed in accordance with the third embodiment of the present invention.

FIG. 48 is a cross-sectional view of the structure with the first heat spreader 22 spaced from the peripheral edges of the structure by selectively removing portions of the first heat spreader 22 using photolithography and wet etching. The remaining portion of the first heat spreader 22 covers and encloses the first chip 13 within the cavity 221 from above.

Figure 49:
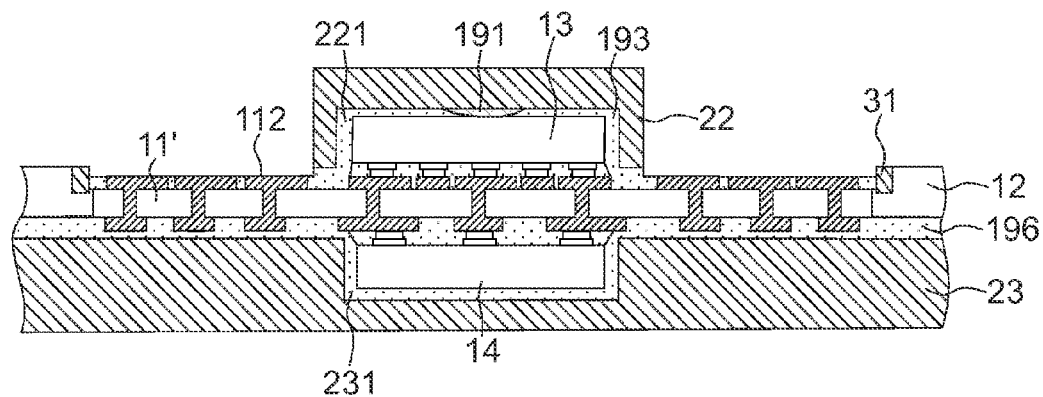
FIG. 49 is a cross-sectional view showing a state in which the exposed adhesive of FIG. 48 is removed in accordance with the third embodiment of the present invention.

FIG. 49 is a cross-sectional view of the structure after removal of the adhesive 193 beyond the peripheral edges of the remaining portion of the first heat spreader 22 and above the first contact pads 112 of the interposer 11'. The adhesive 193 is removed from the first contact pads 112 of the interposer 11' so as to expose the first contact pads 112 on the first surface 111 of the interposer 11' from above.

Figure 50:
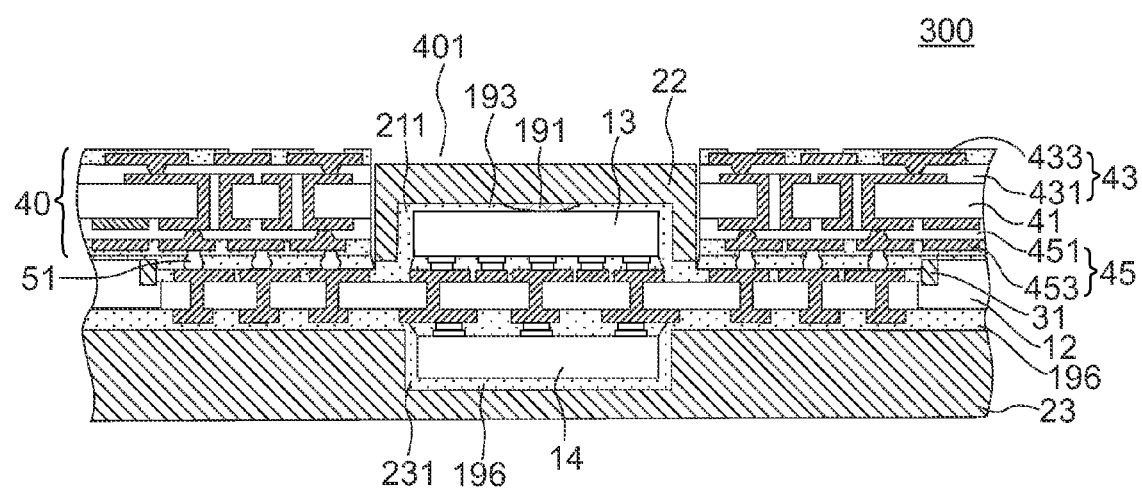
FIG. 50 is a cross-sectional view showing a state in which an interconnect substrate is mounted on the structure of FIG. 49 to finish the fabrication of a semiconductor device in accordance with the third embodiment of the present invention.

FIG. 50 is a cross-sectional view of the structure with an interconnect substrate 40 electrically coupled to the interposer 11'. The remaining portion of the first heat spreader 22 is inserted into a through opening 401 of the interconnect substrate 40, and the interconnect substrate 40 is electrically coupled to the interposer 11' by solder balls 51 that contact the first contact pads 112 of the interposer 11' and the bottom buildup circuitry 45 of the interconnect substrate 40.

Accordingly, as shown in FIG. 50, a semiconductor device 300 is accomplished and includes an interposer 11', a first chip 13, a second chip 14, a balancing layer 12, a first heat spreader 22, a second heat spreader 23, an alignment guide 31 and an interconnect substrate 40. The first chip 13 is electrically coupled to first contact pads 112 of the pre-fabricated interposer 11' by flip chip process to form a chip-on-interposer subassembly 10. The chip-on-interposer subassembly 10 is attached to the first heat spreader 22 using a thermally conductive material 191 and an adhesive 193 with the first chip 13 positioned within the cavity 221 and the interposer 11' laterally extending beyond the cavity 221. The thermally conductive material 191 provides mechanical bonds and thermal connection between the first chip 13 and the first heat spreader 22, and the adhesive 193 provides mechanical bonds between the first chip 13 and the first heat spreader 22 and between the interposer 11' and the first heat spreader 22. The first heat spreader 22 encloses the first chip 13 within its cavity 221 and is spaced from the peripheral edges of the device. The alignment guide 31 is essentially coplanar with the first surface 121 of the balancing layer 12 in the upward direction and extends beyond the first surface 111 of the interposer 11' in the downward direction and is in close proximity to the peripheral edges of the interposer 11' to provide critical placement accuracy for the interposer 11'. The second chip 14 is electrically coupled to the second contact pads 114 of the interposer 11' by flip chip process and is further electrically connected to the first chip 13 by the through vias 116 of the interposer 11'. The balancing layer 12 laterally covers the sidewalls of the interposer 11' and laterally extends to the peripheral edges of the device and is essentially coplanar with the alignment guide 31 in the upward direction and with the interposer 11' in the downward direction. The second heat spreader 23 laterally extends to the peripheral edges of the device and is attached to the second chip 14, the interposer 11' and the balancing layer 12 using a thermally conductive material 196 with the second chip 14 positioned within its cavity 231. The thermally conductive material 196 provides mechanical bonds and thermal connection between the second chip 14 and the second heat spreader 23 and between the interposer 11' and the second heat spreader 23 and between the balancing layer 12 and the second heat spreader 23. The interconnect substrate 40 is electrically coupled to the first contact pads 112 of the interposer 11' by solder balls 51 to provide second level routing.

Embodiment 4

FIGS. 51-54 are schematic views showing a method of making yet another semiconductor device in which the second chip is enclosed in a cavity of a second heat spreader that is spaced from the peripheral edges of the device in accordance with yet another embodiment of the present invention.

For purposes of brevity, any description in the aforementioned Embodiments is incorporated herein insofar as the same is applicable, and the same description need not be repeated.

Figure 51:
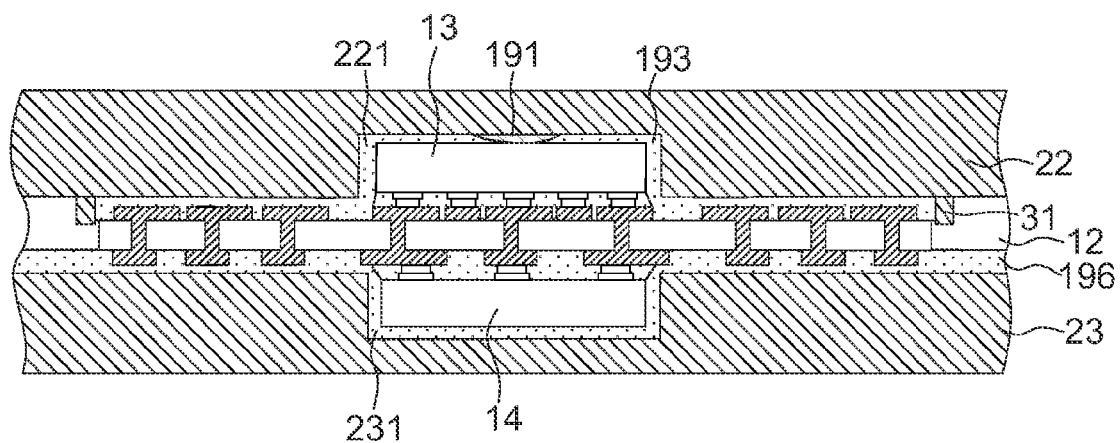
FIG. 51 is a cross-sectional view showing a state in which chips are face-to-face mounted on an interposer and enclosed in separate heat spreaders in accordance with the fourth embodiment of the present invention.

FIG. 51 is a cross-sectional view of the structure that is manufactured by the steps shown in FIGS. 43-47.

Figure 52:
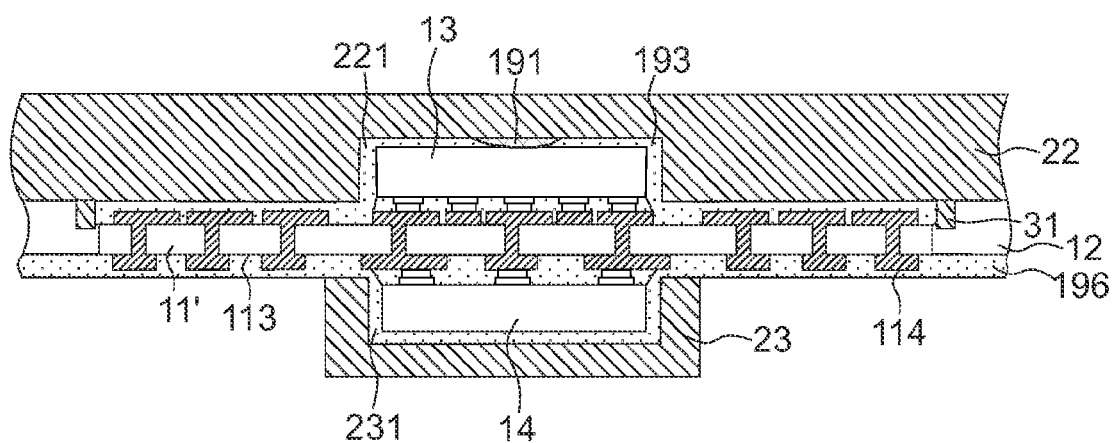
FIG. 52 is a cross-sectional view showing a state in which the lower heat spreader of FIG. 51 is selectively removed in accordance with the fourth embodiment of the present invention.

FIG. 52 is a cross-sectional view of the structure with the second heat spreader 23 spaced from the peripheral edges of the structure by selectively removing portions of the second heat spreader 23 using photolithography and wet etching. The remaining portion of the second heat spreader 23 covers and encloses the second chip 14 within the cavity 231 from below.

Figure 53:
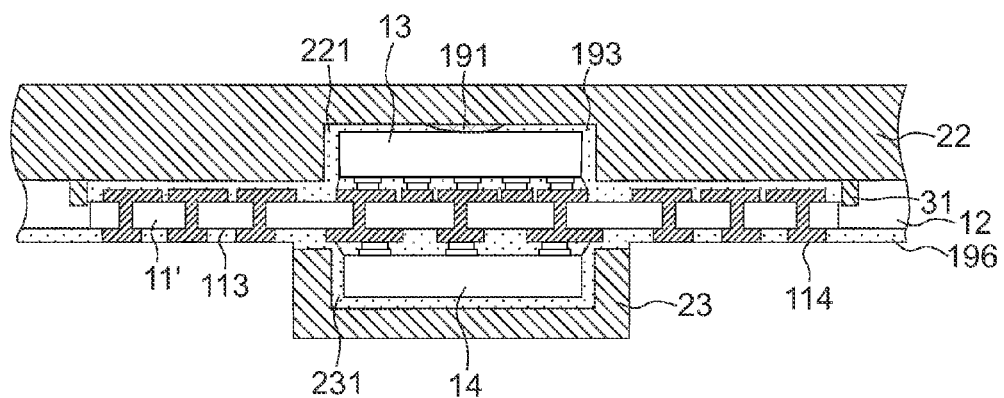
FIG. 53 is a cross-sectional view showing a state in which the exposed adhesive of FIG. 52 is removed in accordance with the fourth embodiment of the present invention.

FIG. 53 is a cross-sectional view of the structure after removal of the thermally conductive material 196 beyond the peripheral edges of the remaining portion of the second heat spreader 23 and below the second contact pads 114 of the interposer 11'. The thermally conductive material 196 is removed from the second contact pads 114 of the interposer 11' so as to expose the second contact pads 114 on the second surface 113 of the interposer 11' from below.

Figure 54:
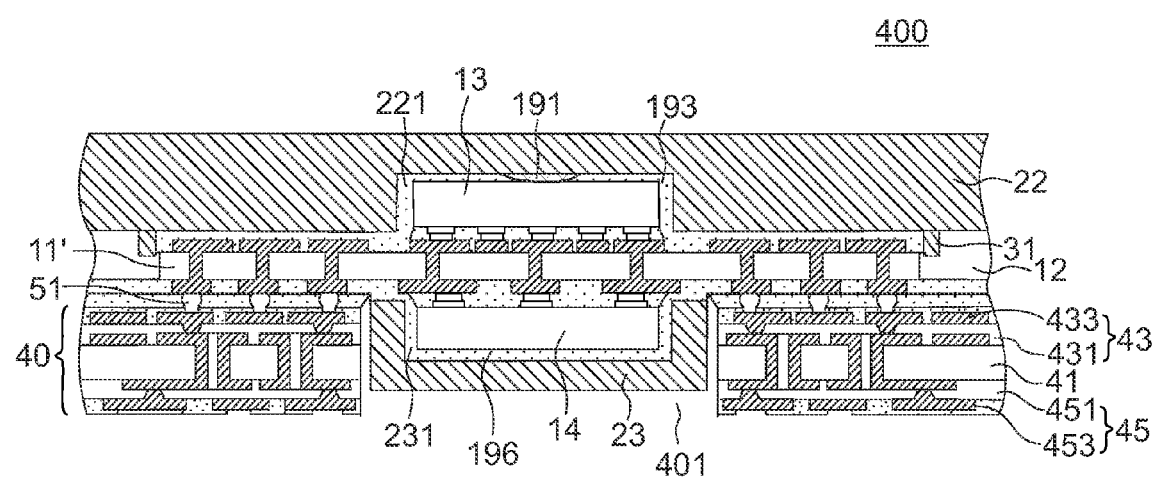
FIG. 54 is a cross-sectional view showing a state in which an interconnect substrate is mounted on the structure of the FIG. 53 to finish the fabrication of a semiconductor device in accordance with the fourth embodiment of the present invention.

FIG. 54 is a cross-sectional view of the structure with an interconnect substrate 40 electrically coupled to the interposer 11'. The remaining portion of the second heat spreader 23 is inserted into a through opening 401 of the interconnect substrate 40, and the interconnect substrate 40 is electrically coupled to the interposer 11' by solder balls 51 that contact the second contact pads 114 of the interposer 11' and the top buildup circuitry 43 of the interconnect substrate 40.

Accordingly, as shown in FIG. 54, a semiconductor device 400 is accomplished and includes an interposer 11', a first chip 13, a second chip 14, a balancing layer 12, a first heat spreader 22, a second heat spreader 23, an alignment guide 31 and an interconnect substrate 40. The first chip 13 is electrically coupled to the first contact pads 112 of the pre-fabricated interposer 11' by flip chip process to form a chip-on-interposer subassembly 10. The chip-on-interposer subassembly 10 is attached to the first heat spreader 22 using a thermally conductive material 19 and an adhesive 193 with the first chip 13 positioned within the cavity 221 and the interposer 11' laterally extending beyond the cavity 221. The thermally conductive material 191 provides mechanical bonds and thermal connection between the first chip 13 and the first heat spreader 22, and the adhesive 193 provides mechanical bonds between the first chip 13 and the first heat spreader 22 and between the interposer 11' and the first heat spreader 22. The first heat spreader 22 encloses the first chip 13 within its cavity 221 and laterally extends to the peripheral edges of the device. The alignment guide 31 is essentially coplanar with the first surface 121 of the balancing layer 12 in the upward direction and extends beyond the first surface 111 of the interposer 11' in the downward direction and is in close proximity to the peripheral edges of the interposer 11' to provide critical placement accuracy for the interposer 11'. The second chip 14 is electrically coupled to the second contact pads 114 of the interposer 11' by flip chip process and is further electrically connected to the first chip 13 by the through vias 116 of the interposer 11'. The balancing layer 12 laterally covers the sidewalls of the interposer 11' and laterally extends to the peripheral edges of the device and is essentially coplanar with the alignment guide 31 in the upward direction and with the interposer 11' in the downward direction. The second heat spreader 23 is spaced from the peripheral edges of the device and encloses the second chip 14 within its cavity 231 using a thermally conductive material 196 that provides mechanical bonds and thermal connection between the second chip 14 and the second heat spreader 23. The interconnect substrate 40 is electrically coupled to the second contact pads 114 of the interposer 11' by solder balls 51 to provide second level routing.

The semiconductor devices described above are merely exemplary. Numerous other embodiments are contemplated. In addition, the embodiments described above can be mixed-and-matched with one another and with other embodiments depending on design and reliability considerations. The chip can share or not share the cavity with other chips. For instance, a cavity can accommodate a single chip, and the heat spreader can include multiple cavities arranged in an array for multiple chips. Alternatively, numerous chips can be positioned within a single cavity. Likewise, a chip can share or not share the interposer with other chips. For instance, a single chip can be electrically connected to the interposer. Alternatively, numerous chips may be coupled to the interposer. For instance, four small chips in a 2×2 array can be coupled to the interposer and the interposer can include additional contact pads to receive and route additional chip pads.

As illustrated in the aforementioned embodiments, a distinctive semiconductor device with face-to-face chips on interposer is configured to exhibit improved thermal performance and reliability. In a preferred embodiment, the semiconductor device includes a first chip, a second chip, an interposer and a first heat spreader, wherein (i) the interposer includes a first surface, an opposite second surface, first contact pads on the first surface, second contact pads on the second surface, and through vias that electrically couple the first contact pads and the second contact pads; (ii) the first and second chips are electrically coupled to the first and second contact pads of the interposer by bumps, respectively; and (iii) the first heat spreader has a cavity and is attached to the first chip using a thermally conductive material with the first chip positioned within the cavity and the first surface of the interposer attached to a flat surface of the first heat spreader that is adjacent to and laterally extends from the cavity entrance.

Further, the semiconductor device according to a preferred embodiment may further include a balancing layer, a second heat spreader and an interconnect substrate, wherein (i) the balancing layer covers sidewalls of the interposer; (ii) the second heat spreader is attached on the second chip, or attached to the second chip using a thermally conductive material with the second chip inserted into a cavity of the second heat spreader and the interposer laterally extending beyond the cavity of the second heat spreader; and (iii) the interconnect substrate has a through opening and is electrically coupled to the interposer with the first or second chip positioned within the through opening.

The first and second chips are face-to-face mounted on opposite sides of the interposer and electrically coupled to the first and second contact pads of the interposer by bumps, respectively. The first and second chips can be a packaged or unpackaged chip. Furthermore, the first and second chips can be a bare chip, or a wafer level packaged die, etc.

The first heat spreader can laterally extend beyond the peripheral edges of the interposer and further extend to the peripheral edges of the device to provide mechanical support for the device. Alternatively, the first heat spreader may be selectively removed and be spaced from the peripheral edges of the device after the second heat spreader is attached on the second surface of the interposer and the second surface of the optional balancing layer. As a result, the interposer laterally can extend beyond the peripheral edges of a remaining portion of the first heat spreader enclosing the first chip within the cavity to expose additional first contact pads on its first surface. For this aspect of the interposer laterally extending beyond the peripheral edges of the first heat spreader, the second heat spreader preferably extends to the peripheral edges of the device with the second surface of the interposer and the second surface of the optional balancing layer attached to a flat surface of the second heat spreader that is adjacent to the cavity entrance. As another aspect, the second heat spreader may be selectively removed and be spaced from the peripheral edges of the device after the first heat spreader is attached on the first surface of the interposer and the first surface of the optional balancing layer. Accordingly, the interposer laterally extends beyond the peripheral edges of a remaining portion of the second heat spreader enclosing the second chip within the cavity to expose additional second contact pads on its second surface. In the aspect of the interposer laterally extending beyond the peripheral edges of the second heat spreader, the first heat spreader preferably extends to the peripheral edges of the device.

The first and second heat spreaders each typically include a metal plate to provide essential thermal dissipation and electromagnetic shielding for the embedded chip. The metal plate can have a thickness of 0.1 mm to 10 mm. The material of the metal plate can include copper, aluminum, stainless steel or their alloys. Further, the first and second heat spreaders can be a single-layer structure or multi-layer structure, and preferably include a cavity extending into the metal plate. For instance, the first and second heat spreaders may be a metal plate having a cavity formed therein and a flat surface that laterally extends from the cavity entrance. Accordingly, the metallic bottom and the metallic sidewalls of the cavity can provide thermal contact surfaces and vertical and horizontal electromagnetic shielding for the embedded chip. In accordance with another aspect of the first heat spreader, the first heat spreader may be a laminate substrate including a metal plate and a dielectric layer on the metal plate, and has a cavity that extends through the dielectric layer and extends into the metal plate. Alternatively, the first heat spreader may include a metal plate and a base layer with an aperture, and has a cavity that is defined by the aperture of the base layer on the metal plate. The material of the base layer can be epoxy, BT, polyimide or other kind of resin or resin/glass composite. As such, the heat from the first chip is dissipated through the metallic bottom of the cavity.

Moreover, an alignment guide may be formed beyond or within the cavity of the first heat spreader for the interposer attachment. Accordingly, the placement accuracy of the chip-on-interposer subassembly can be provided by the alignment guide positioned around the first surface of the interposer or the inactive surface of the first chip. For the aspect of the alignment guide positioned beyond the cavity of the first heat spreader, the alignment guide extends from a flat surface of the first heat spreader adjacent to the cavity entrance and extends beyond the first surface of the interposer in the second vertical direction. For the convenience of description, the direction in which the first surface of the interposer faces is defined as the first vertical direction, and the direction in which the second surface of the interposer faces is defined as the second vertical direction. As for another aspect of the alignment guide positioned within the cavity of the first heat spreader, the alignment guide extends from the cavity bottom and extends beyond the inactive surface of the flip chip in the second vertical direction. As such, the interposer placement accuracy can be provided by the alignment guide that is laterally aligned with and in close proximity to the peripheral edges of the interposer or the first chip.

The alignment guide can be formed around the cavity entrance of the first heat spreader by the steps of: providing a metal plate; forming a cavity in the metal plate; and forming an alignment guide around the entrance of the cavity by removing a selected portion of the metal plate or by pattern deposition of a metal or a plastic material on the metal plate to form the alignment guide. Accordingly, the heat spreader is a metal plate having a cavity formed therein, and the alignment guide extends from a flat surface of the first heat spreader adjacent to the cavity entrance in the second vertical direction. Also, the alignment guide may be formed around the cavity entrance of the first heat spreader by the steps of: providing a laminate substrate that includes a dielectric layer and a metal plate; forming an alignment guide on the dielectric layer by removing a selected portion of a metal layer on the dielectric layer or by pattern deposition of a metal or a plastic material on the dielectric layer to form the alignment guide; and forming a cavity that extends through the dielectric layer and extends into the metal plate. As a result, the first heat spreader is a laminate substrate including a metal plate and a dielectric layer, and the alignment guide extends from the dielectric layer of the first heat spreader in the second vertical direction and is positioned around the cavity entrance. For the aspect of the alignment guide positioned within the cavity of the first heat spreader, it can be achieved by the steps of: providing a metal plate; forming the alignment guide at a surface of the metal plate by removing a selected portion of the metal plate or by pattern deposition of a metal or a plastic material on the metal plate; and providing a base layer on the metal plate with the alignment guide located within an aperture of the base layer. As such, the first heat spreader includes the metal plate and the base layer, and the alignment guide extends from the metal plate of the first heat spreader in the second vertical direction at its cavity bottom.

The alignment guide can be made of a metal, a photosensitive plastic material or non-photosensitive material. For instance, the alignment guide can consist essentially of copper, aluminum, nickel, iron, tin or their alloys. The alignment guide can also include or consist of epoxy or polyimide. Further, the alignment guide can have various patterns against undesirable movement of the interposer or the first chip. For instance, the alignment guide can include a continuous or discontinuous strip or an array of posts. Alternatively, the alignment guide may laterally extend to the peripheral edges of the device and have inner peripheral edges that conform to the peripheral edges of the interposer. Specifically, the alignment guide can be laterally aligned with four lateral surfaces of the interposer or the first chip to define an area with the same or similar topography as the interposer or the first chip and prevent the lateral displacement of the interposer or the first chip. For instance, the alignment guide can be aligned along and conform to four sides, two diagonal corners or four corners of the interposer or the first chip, and the gaps in between the interposer and the alignment guide or between the first chip and the alignment guide preferably is in a range of about 5 to 50 microns. As a result, the alignment guide located beyond the interposer or the first chip can provide placement accuracy for the chip-on-interposer subassembly. Besides, the alignment guide preferably has a height in a range of 5-200 microns.

The cavity of the first and second heat spreaders can have a larger diameter or dimension at its entrance than at its bottom and a depth of 0.05 mm to 1.0 mm. For instance, the cavity can have a cut-off conical or pyramidal shape in which its diameter or dimension increases as it extends from its bottom to its entrance. Alternatively, the cavity can have a cylindrical shape with a constant diameter. The cavity can also have a circular, square or rectangular periphery at its entrance and its bottom.

The attachment of the chip-on-interposer subassembly to the first heat spreader can be implemented by a thermally conductive material (such as thermally conductive adhesive) that is first dispensed on the cavity bottom and then squeezed partially out of the cavity when inserting the first chip into the cavity of the first heat spreader. The thermally conductive material can contact and surround the embedded first chip within the cavity of the first heat spreader. The squeezed out portion can contact and be sandwiched between the first surface of the interposer and the flat surface of the first heat spreader that laterally extends from the cavity entrance. Alternatively, a thermally conductive material (such as thermally conductive adhesive) can be dispensed on the cavity bottom and be contained within the cavity when inserting the first chip into the cavity. A second adhesive (typically an electrically insulating underfill) can then be dispensed and filled into the remaining space within the cavity and extends to the space between the first surface of the interposer and the flat surface of the first heat spreader that laterally extends from the cavity entrance. Accordingly, the thermally conductive material provides mechanical bonds and thermal connection between the first chip and the first heat spreader while the adhesive provides mechanical bonds between the interposer and the first heat spreader. Likewise, the aforementioned procedure also can be applied in the attachment of the second heat spreader to the second surface of the interposer and the second surface of the optional balancing layer. Therefore, the attachment of the second heat spreader can be achieved by a thermally conductive material that fills the cavity of the second heat spreader and the space between the second surface of the interposer and the second heat spreader and between the second surface of the balancing layer and the second heat spreader.

The interposer laterally extends beyond the cavity of the first heat spreader and can be attached to the flat surface of the first heat spreader adjacent to the cavity entrance with its first surface facing the first heat spreader. Likewise, in the aspect of the second chip positioned within the cavity of the second heat spreader, the interposer laterally extends beyond the cavity of the second heat spreader and is attached to the flat surface of the second heat spreader adjacent to the cavity entrance with its second surface facing the second heat spreader. The interposer can be a silicon, glass, ceramic or graphite material with a thickness of 50 to 500 microns, and can provide fan-out routing for the first and second chips disposed on its opposite sides. Additionally, as the interposer is typically made of a high elasticity modulus material with CTE (coefficient of thermal expansion) closely matching that of the chip (for example, 3 to 10 ppm per degree Centigrade), internal stresses in chip and its electrical interconnection caused by CTE mismatch can be largely compensated or reduced.

The balancing layer can be deposited on the first heat spreader or the alignment guide after the step of attaching the chip-on-interposer to the first heat spreader. As a result, the balancing layer can have a first surface in contact with the first heat spreader or the alignment guide and an opposite second surface substantially coplanar with the second surface of the interposer. In any case, the balancing layer preferably laterally covers and surrounds and conformally coats the sidewalls of the interposer and extends laterally from the interposer to the peripheral edges of the device. The material of the balancing layer can be epoxy, BT, polyimide and other kinds of resin or resin/glass composite.

The interconnect substrate can be electrically coupled to additional first or second contact pads of the interposer after the step of providing the balancing layer. The interconnect substrate is not limited to a particular structure, and for instance, may include a core layer, top and bottom buildup circuitries and plated through holes. The top and bottom buildup circuitries are disposed on both opposite sides of the core layer. The plated through holes extend through the core layer and provide electrical connections between the top and bottom buildup circuitries. Each of the top and bottom buildup circuitries typically includes an insulating layer and one or more conductive traces. The insulating layers of the top and bottom buildup circuitries are respectively deposited on opposite sides of the core layer. The conductive traces extend laterally on the insulating layer and extend through via openings in the insulating layer to form conductive vias in contact with top and bottom patterned wiring layers of the core layer. Further, the top and bottom buildup circuitries can include additional insulating layers, additional via openings, and additional conductive traces if needed for further signal routing. The outmost conductive traces of the top and bottom buildup circuitries can respectively accommodate conductive joints, such as solder balls, for electrical communication and mechanical attachment with for an assembly or electronic device. Accordingly, the interconnect substrate can be attached to the interposer by solder balls, not by direct build-up process, to provide secondary fan-out routing/interconnection. Further, the interconnect substrate preferably has a through opening to accommodate the first or second chip within the through opening. For instance, in the aspect of the interposer extending beyond the peripheral edges of the first heat spreader, the interconnect substrate can be electrically coupled to the first contact pads of the interposer with the first heat spreader as well as the first chip positioned within the through opening of the interconnect substrate. As for the aspect of the interposer extending beyond the peripheral edges of the second heat spreader, the interconnect substrate can be electrically coupled to the second contact pads of the interposer with the second heat spreader as well as the second chip positioned within the through opening of the interconnect substrate.

The term "cover" refers to incomplete or complete coverage in a vertical and/or lateral direction. For instance, in the position that the cavity of the first heat spreader faces the downward direction, the first heat spreader covers the first chip in the upward direction regardless of whether another element such as the thermally conductive material is between the first heat spreader and the first chip.

The phrase "aligned with" refers to relative position between elements regardless of whether elements are spaced from or adjacent to one another or one element is inserted into and extends into the other element. For instance, the alignment guide is laterally aligned with the interposer since an imaginary horizontal line intersects the alignment guide and the interposer, regardless of whether another element is between the alignment guide and the interposer and is intersected by the line, and regardless of whether another imaginary horizontal line intersects the interposer but not the alignment guide or intersects the alignment guide but not the interposer.

The phrase "in close proximity to" refers to a gap between elements not being wider than a maximum acceptable limit. As known in the art, when the gap between the alignment guide and the interposer is not narrow enough, the location error of the interposer due to the lateral displacement of the interposer within the gap may exceed the maximum acceptable error limit. In some cases, once the location error of the interposer goes beyond the maximum limit, it may cause difficulty in subsequent procedures for interconnecting chips to the interposer. According to the pad size of the interposer, those skilled in the art can ascertain the maximum acceptable limit for a gap between the interposer and the alignment guide through trial and error to ensure I/O pads of the chips being aligned with the contact pads of the interposer. Thereby, the description "the alignment guide is in close proximity to the peripheral edges of the interposer" and "the alignment guide is in close proximity to the peripheral edges of the first chip" mean that the gap between the alignment guide and the peripheral edges of the interposer or the first chip is narrow enough to prevent the location error of the interposer from exceeding the maximum acceptable error limit.

The phrases "electrical connection" and "electrically connected", "electrically coupled" and "electrically couple" refer to direct and indirect electrical connection. For instance, the first chip is electrically connected to the second chip by bumps and the interposer.

The "first vertical direction" and "second vertical direction" do not depend on the orientation of the semiconductor device, as will be readily apparent to those skilled in the art. For instance, the first surface of the interposer faces the first vertical direction and the second surface of the interposer faces the second vertical direction regardless of whether the device is inverted. Likewise, the alignment guide is "laterally" aligned with the interposer in a lateral plane regardless of whether the device is inverted, rotated or slanted. Thus, the first and second vertical directions are opposite one another and orthogonal to the lateral directions, and a lateral plane orthogonal to the first and second vertical directions intersects laterally aligned elements.

The semiconductor device according to the present invention has numerous advantages. For instance, the chips are face-to-face mounted on opposite sides of the interposer by a well-known flip chip bonding process such as thermo-compression or solder reflow, which can offer the shortest interconnect distance between the chips. The interposer provides a first level fan-out routing/interconnection for the chips whereas the interconnect substrate provides a second level fan-out routing/interconnection. As the interconnect substrate can be attached to the interposer by solder balls, not by direct build-up process, the simplified process steps result in lower manufacturing cost. The alignment guide can provide critical placement accuracy for the interposer. As such, the shape or depth of the cavity that houses the embedded chip is not a critical parameter that needs to be tightly controlled. The face-to-face mounted chips can be thermally connected to separate heat spreaders. The heat spreader can provide thermal dissipation, electromagnetic shielding and moisture barrier for the embedded chip, and also provides mechanical support for the chip, the interposer and the interconnect substrate. The semiconductor device made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A semiconductor device with face-to-face chips on interposer, comprising:
    a first chip;
    a second chip;
    an alignment guide;
    a first heat spreader having a cavity; and
    an interposer having a first surface, a second surface opposite to the first surface, first contact pads on the first surface, second contact pads on the second surface, and through vias that electrically couple the first contact pads and the second contact pads,
    wherein the first chip is electrically coupled to the first contact pads of the interposer by a plurality of bumps to provide a chip-on-interposer subassembly;
    the chip-on-interposer subassembly is attached to the first heat spreader using a thermally conductive material with the first chip enclosed in the cavity and the interposer laterally extending beyond the cavity;
    the second chip is electrically coupled to the second contact pads of the interposer by a plurality of bumps; and
    the alignment guide is positioned beyond the cavity of the first heat spreader and laterally aligned with and in close proximity to peripheral edges of the interposer; or the alignment guide is positioned within the cavity of the first heat spreader and laterally aligned with and in close proximity to peripheral edges of the first chip.

2. The semiconductor device of claim 1, further comprising a balancing layer that covers sidewalls of the interposer.

3. The semiconductor device of claim 2, further comprising an interconnect substrate that has a through opening and is electrically coupled to additional second contact pads on the second surface of the interposer by a plurality of solder balls with the second chip inserted into the through opening.

4. The semiconductor device of claim 1, further comprising a second heat spreader that is attached on the second chip.

5. The semiconductor a device of claim 2, further comprising a second heat spreader that has a cavity and is attached to the second chip using a thermally conductive material with the second chip inserted into the cavity of the second heat spreader and the interposer laterally extending beyond the cavity of the second heat spreader, wherein the interposer laterally extends beyond peripheral edges of the first heat spreader to expose additional first contact pads on the first surface of the interposer.

6. The semiconductor device of claim 5, further comprising an interconnect substrate that has a through opening and is electrically coupled to the additional first contact pads of the interposer by a plurality of solder balls with the first heat spreader inserted into the through opening.

7. The semiconductor device of claim 2, further comprising a second heat spreader that has a cavity and is attached to the second chip using a thermally conductive material with the second chip inserted into the cavity of the second heat spreader and the interposer laterally extending beyond the cavity of the second heat spreader, wherein the interposer laterally extends beyond peripheral edges of the second heat spreader to expose additional second contact pads on the second surface of the interposer.

8. The semiconductor device of claim 7, further comprising an interconnect substrate that has a through opening and is electrically coupled to the additional second contact pads of the interposer by a plurality of solder balls with the second heat spreader inserted into the through opening.

9. A semiconductor device with face-to-face chips on interposer, comprising:
   a first chip;
   a second chip;
   a first heat spreader having a cavity;
   an interposer having a first surface, a second surface opposite to the first surface, first contact pads on the first surface, second contact pads on the second surface, and through vias that electrically couple the first contact pads and the second contact pads; and
   a second heat spreader that has a cavity,
   wherein the first chip is electrically coupled to the first contact pads of the interposer by a plurality of bumps to provide a chip-on-interposer subassembly;
   the chip-on-interposer subassembly is attached to the first heat spreader using a thermally conductive material with the first chip enclosed in the cavity and the interposer laterally extending beyond the cavity;
   the second chip is electrically coupled to the second contact pads of the interposer by a plurality of bumps;
   the second heat spreader is attached to the second chip using a thermally conductive material with the second chip inserted into the cavity of the second heat spreader and the interposer laterally extending beyond the cavity of the second heat spreader; and
   the interposer laterally extends beyond peripheral edges of the first heat spreader to expose additional first contact pads on the first surface of the interposer.

10. The semiconductor device of claim 9, further comprising an interconnect substrate that has a through opening and is electrically coupled to the additional first contact pads of the interposer by a plurality of solder balls with the first heat spreader inserted into the through opening.

11. The semiconductor device of claim 9, further comprising a balancing layer that covers sidewalls of the interposer.

12. The semiconductor device of claim 11, further comprising an interconnect substrate that has a through opening and is electrically coupled to the additional first contact pads of the interposer by a plurality of solder balls with the first heat spreader inserted into the through opening.

13. A semiconductor device with face-to-face chips on interposer, comprising:
   a first chip;
   a second chip;
   a first heat spreader having a cavity;
   an interposer having a first surface, a second surface opposite to the first surface, first contact pads on the first surface, second contact pads on the second surface, and through vias that electrically couple the first contact pads and the second contact pads; and
   an interconnect substrate that has a through opening,
   wherein the first chip is electrically coupled to the first contact pads of the interposer by a plurality of bumps to provide a chip-on-interposer subassembly;
   the chip-on-interposer subassembly is attached to the first heat spreader using a thermally conductive material with the first chip enclosed in the cavity and the interposer laterally extending beyond the cavity;
   the second chip is electrically coupled to the second contact pads of the interposer by a plurality of bumps; and
   the interconnect substrate is electrically coupled to additional second contact pads on the second surface of the interposer by a plurality of solder balls with the second chip inserted into the through opening.

14. The semiconductor device of claim 13, further comprising a balancing layer that covers sidewalls of the interposer.

* * * * *